US010935370B2

(12) United States Patent
Ahmed et al.

(10) Patent No.: US 10,935,370 B2
(45) Date of Patent: *Mar. 2, 2021

(54) DEFORMOMETER FOR DETERMINING DEFORMATION OF AN OPTICAL CAVITY OPTIC

(71) Applicant: Government of the United States of America, as represented by the Secretary of Commerce, Gaithersburg, MD (US)

(72) Inventors: Zeeshan Ahmed, Washington, DC (US); Kevin O. Douglass, Ellicott City, MD (US); Stephen P. Eckel, Rockville, MD (US); Patrick F. Egan, Rockville, MD (US); Jay H. Hendricks, Clarksburg, MD (US); Jack A. Stone, Jr., Silver Spring, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/520,668

(22) Filed: Jul. 24, 2019

(65) Prior Publication Data
US 2020/0041255 A1 Feb. 6, 2020

Related U.S. Application Data
(63) Continuation-in-part of application No. 62/714,953, filed on Aug. 6, 2018.

(51) Int. Cl.
*G01B 11/16* (2006.01)
*G02B 27/10* (2006.01)
(Continued)

(52) U.S. Cl.
CPC .......... *G01B 11/16* (2013.01); *G02B 27/1006* (2013.01); *H01S 3/23* (2013.01);
(Continued)

(58) Field of Classification Search
CPC ....... G01B 11/16; G01B 11/161; G01B 11/18; G02B 27/1006
See application file for complete search history.

(56) References Cited

U.S. PATENT DOCUMENTS 4,070,683 A * 1/1978 Altschuler ......... G01B 11/2513
356/2
5,917,180 A * 6/1999 Reimer ..................... G01L 1/24
250/227.14
(Continued)

FOREIGN PATENT DOCUMENTS

RU 2089848 C1 * 9/1997

OTHER PUBLICATIONS

Egan, Patrick F. et al. "Cell-based refractometer for pascal realization". Optics Letters, vol. 42, No. 15, Aug. 1, 2017, pp. 2944-2947. (Year: 2017).*
(Continued)

Primary Examiner — Michael A Lyons
(74) Attorney, Agent, or Firm — Office of Chief Counsel for National Institute of Standards and Technology

(57) ABSTRACT

A deformometer includes: a cavity body; entry and exit optical cavity optics, such that the optical cavity produces filtered combined light from combined light; a first laser that provides first light; a second laser that provides second light; an optical combiner that: receives the first light; receives the second light; combines the first light and the second light; produces combined light from the first light and the second light; and communicates the combined light to the entry optical cavity optic; a beam splitter that: receives the filtered
(Continued)

combined light; splits the filtered combined light; a first light detector in optical communication with the beam splitter and that: receives the first filtered light from the beam splitter; and produces a first cavity signal from the first filtered light; and a second light detector that: receives the second filtered light; and produces a second cavity signal from the second filtered light.

4 Claims, 19 Drawing Sheets

(51) Int. Cl.
    *H01S 5/40*           (2006.01)
    *H01S 3/23*           (2006.01)
    *H01S 3/16*           (2006.01)
    *H01S 3/22*           (2006.01)
    *H01S 3/107*          (2006.01)
    *G02B 27/28*         (2006.01)

(52) U.S. Cl.
    CPC .......... *H01S 5/4012* (2013.01); *H01S 5/4075* (2013.01); *H01S 5/4087* (2013.01); *G02B 27/283* (2013.01); *H01S 3/107* (2013.01); *H01S 3/1625* (2013.01); *H01S 3/1636* (2013.01); *H01S 3/2222* (2013.01)

(56) References Cited

U.S. PATENT DOCUMENTS

| | | | |
|---|---|---|---|
| 7,355,723 B2* | 4/2008 | Carr | G01H 9/006 |
| | | | 356/35.5 |
| 9,719,878 B2 | 8/2017 | Hendricks et al. | |
| 2002/0162952 A1* | 11/2002 | Stuetzler | G01L 25/00 |
| | | | 250/227.14 |
| 2020/0041256 A1* | 2/2020 | Ahmed | G01B 11/16 |
| 2020/0041257 A1* | 2/2020 | Egan | G01B 9/02008 |
| 2020/0041379 A1* | 2/2020 | Douglass | G01M 11/335 |

OTHER PUBLICATIONS

Kamenev, O.T. et al. "Use of a Fiber-Optic Mach-Zehnder Interferometer for Creating a Deformometer with Extended Gage Length" . Technical Physics Letters, vol. 40, No. 2, 2014, pp. 119-122. (Year: 2014).*

Scherschligt, J., et al., "Review Article: Quantum-based vacuum metrology at the National Institute of Standards and Technology", Journal of Vacuum Science and Technology, 2018, 040801, vol. 36.

Jousten, K., et al., "Perspectives for a new realization of the pascal by optical methods", Metrologia, 217, S146-S161, vol. 54.

Stone, J., et al., "Refractometry Using a Helium Standard", 2004, revised 2017, NIST publications.

Stone, J., et al., "Pictometers to Pascals: how precise length measurements enable new photonic pressure standards", JVC Slovenia, 16th Joint Vacuum Conference (JVC-16)/ 14th European Vacuum conference (EVC-14), Jun. 6-10, 2016.

* cited by examiner

DEFORMOMETER FOR DETERMINING DEFORMATION OF AN OPTICAL CAVITY OPTIC

CROSS REFERENCE TO RELATED APPLICATIONS

The application claims priority to U.S. Provisional Patent Application Ser. No. 62/714,953 filed Aug. 6, 2018, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov.

BRIEF DESCRIPTION

Disclosed is a deformometer for determining deformation of an optical cavity disposed on an optical cavity, the deformometer comprising: the optical cavity comprising: a cavity body; an entry optical cavity optic disposed at an entry end of cavity body and that receives combined light; and an exit optical cavity optic disposed at an exit end of cavity body, the entry optical cavity optic in optical communication and optically opposing the exit optical cavity optic, such that the exit optical cavity optic receives the combined light from the entry optical cavity optic, such that the optical cavity produces filtered combined light from the combined light; a first laser in optical communication with entry optical cavity optic and that provides first light; a second laser in optical communication with entry optical cavity optic and that provides second light; an optical combiner in optical communication with the entry optical cavity optic and that: receives the first light from the first laser; receives the second light from the second laser; combines the first light and the second light; produces combined light from the first light and the second light; and communicates the combined light to the entry optical cavity optic; a beam splitter in optical communication with the exit optical cavity optic and that: receives the filtered combined light from the optical cavity; splits the filtered combined light into first filtered light and second filtered light; a first light detector in optical communication with the beam splitter and that: receives the first filtered light from the beam splitter; and produces a first cavity signal from the first filtered light; and a second light detector in optical communication with the beam splitter and that: receives the second filtered light from the beam splitter; and produces a second cavity signal from the second filtered light, from which a deformation of the entry optical cavity optic and exit optical cavity optic is determined.

Disclosed is a deformometer for determining deformation of an optical cavity optic disposed on an optical cavity, the deformometer comprising: the optical cavity comprising: a cavity body; an entry optical cavity optic disposed at an entry end of cavity body and that receives combined light; and an exit optical cavity optic disposed at an exit end of cavity body, the entry optical cavity optic in optical communication and optically opposing the exit optical cavity optic, such that the exit optical cavity optic receives the combined light from the entry optical cavity optic, such that the optical cavity produces filtered combined light from the combined light; a first laser in optical communication with entry optical cavity optic and that provides first light; a second laser in optical communication with entry optical cavity optic and that provides second light; a first optical combiner in optical communication with the entry optical cavity optic and that: receives the first light from the first laser; receives the second light from the second laser; combines the first light and the second light; produces combined light from the first light and the second light; and communicates the combined light to the entry optical cavity optic; a second optical combiner in optical communication with the exit optical cavity optic and that: receives the filtered combined light from the optical cavity; splits the filtered combined light into first filtered light and second filtered light; a first light detector in optical communication with the second optical combiner and that: receives the first filtered light from the second optical combiner; and produces a first cavity signal from the first filtered light; and a beam splitter in optical communication with the second optical combiner and that: receives the second filtered light from the second optical combiner; communicates a portion of the second filtered light to an imager; and communicates a second portion of the second filtered light to a second light detector; the second light detector in optical communication with the beam splitter and that: receives the second filtered light from the beam splitter; and produces a second cavity signal from the second filtered light, from which a deformation of the entry optical cavity optic and exit optical cavity optic is determined; and the imager in optical communication with the beam splitter and that: receives the second filtered light from the beam splitter; and produces an image signal from the second filtered light; an optical frequency comb source that produces a set of optical frequencies; a seed light detector that: receives the comb seed light from the seed laser; receives the optical frequency comb from the optical frequency comb source; and produces a first reference signal from the first light and the first optical frequency comb; and a second reference light detector that: receives the second light from the second laser; receives the second optical frequency comb from the optical frequency comb source; and produces a second reference signal from the second light and the second optical frequency comb.

Disclosed is a deformometer for determining deformation of an optical cavity optic disposed on an optical cavity, the deformometer comprising: a first optical cavity comprising: a first cavity body; a first entry optical cavity optic disposed at an entry end of first cavity body and that receives optical frequency comb; and a first exit optical cavity optic disposed at an exit end of first cavity body, the first entry optical cavity optic in optical communication and optically opposing the first exit optical cavity optic, such that the first exit optical cavity optic receives the combined light from the first entry optical cavity optic, such that the first optical cavity produces filtered frequency light from the combined light; an optical frequency comb source in optical communication with first entry optical cavity optic and that provides an optical frequency comb; a beam splitter in optical communication with the first entry optical cavity optic and that: receives the optical frequency comb from the optical frequency comb source; splits a portion of the optical frequency comb to produce feedback light; and communicates the feedback light to optical frequency comb source as feedback control for the optical frequency comb source; a Fourier transform spectrometer in optical communication with the optical cavity and that: receives the shifted frequency light from the optical cavity; and produces a deformation signal from the shifted frequency light from which a deformation of the optical cavity optic and first exit optical cavity optic is determined.

Disclosed is a deformometer that determines deformation of an optical cavity optic disposed on an optical cell and includes an optical cell including a cell body; an entry optical cell optic disposed at an entry end of cell body and that receives combined light; and an exit optical cavity optic disposed at an exit end of the cell body, wherein the entry optical cavity optic is in optical communication and optically opposes exit optical cavity optic, such that the exit optical cell optic receives the combined light from the entry optical cavity optic, and the optical cell produces shifted combined light from the combined light; a first laser in optical communication with entry the entry optical cavity optic and that provides first light; a second laser in optical communication with the entry optical cavity optic and that provides second light; a propagation coupler in optical communication with the first laser; a beam splitter that receives the first light and the second light before communication into the optical cell; a second beam splitter to receive filtered combined light and shifted combined light from the optical cell; an optical combiner that splits filtered light received from the second beam splitter and produces a first cavity signal and a second cavity signal; a first light detector that receives the first cavity signal and produces a second filtered light; a second phase detector that receives the second filtered light from the first light detector; a second light detector that receives the second cavity signal from the optical combiner and produces a first cavity signal; and a first phase detector that receives the first cavity signal from the second light detector.

Disclosed is a deformometer for determining deformation of an optical cavity optic disposed on an optical cavity, the deformometer comprising: a first optical cavity comprising: a cavity body; a first entry optical cavity optic disposed at an entry end of the cavity body; and a first exit optical cavity optic disposed at an exit end of cavity body, the first entry optical cavity optic in optical communication and optically opposing the first exit optical cavity optic, such that the first optical cavity: receives a reference gas at a first pressure P1; receives a first light; and produces a first filtered light from the first light; the first entry optical cavity optic in optical communication and optically opposing the first exit optical cavity optic, such that the first optical cavity: receives a different reference gas at a first pressure P1; receives a first light; and produces a first filtered light from the first light; a second optical cavity comprising: a second entry optical cavity optic disposed at the entry end of the cavity body; and a second exit optical cavity optic disposed at the exit end of the cavity body, the second entry optical cavity optic in optical communication and optically opposing the second exit optical cavity optic, such that the second optical cavity: receives a second gas at a second pressure P2; receives a second light; and produces a second filtered light from the second light; a gas source in fluid communication with the second optical cavity and providing the second gas to the second optical cavity; and a second pump in fluid communication with the optical cavity to pump the second gas from the optical cavity; a first laser in optical communication with the first optical cavity and that provides the first light to the first optical cavity; and a second laser in optical communication with the second optical cavity and that provides the second light to the second optical cavity, such that the deformation of the first optical cavity optic, the second optical cavity optic, the third optical cavity optic, and the fourth optical cavity optic is determined from the first cavity signal and the second cavity signal.

Disclosed is a process for determining deformation of an optical cavity optic disposed on an optical cavity with a deformometer, the process comprising: combining first light with a second light; producing combined light from the first light and the second light; receiving, an entry optical cavity optic disposed at an entry end of a cavity body of a deformometer, the combined light; transmitting, from the first optical cavity optic to an exit optical cavity optic disposed at an exit end of the cavity body, the combined light, the entry optical cavity optic being in optical communication and optically opposing the exit optical cavity optic; receiving, by the exit optical cavity optic, the combined light; producing a filtered combined light from the combined light by transmitted the combined light from the first optical cavity optic and from the second optical cavity optic; producing, from the filtered combined light, a first filtered light and a second filtered light; analyzing the first filtered light and the second filtered light to determine the deformation of the entry optical cavity optic and the exit optical cavity optic.

BRIEF DESCRIPTION OF THE DRAWINGS

The following description should not be considered limiting in any way. With reference to the accompanying drawings, like elements are numbered alike.

DETAILED DESCRIPTION

A detailed description of one or more embodiments is presented herein by way of exemplification and not limitation.

It has been discovered that a deformometer and process described herein includes a plurality of wavelengths of light or species of gas to measure a deformation of an optical cavity, cell, or other optical element that holds gas, wherein the deformation occurs due to a force exerted by the gas. The deformometer determines a difference between an index of refraction of gases, wavelengths, or a combination thereof. Advantageously, a combination of such determines a distortion of an optical cavity filled with gas.

Figure 1:
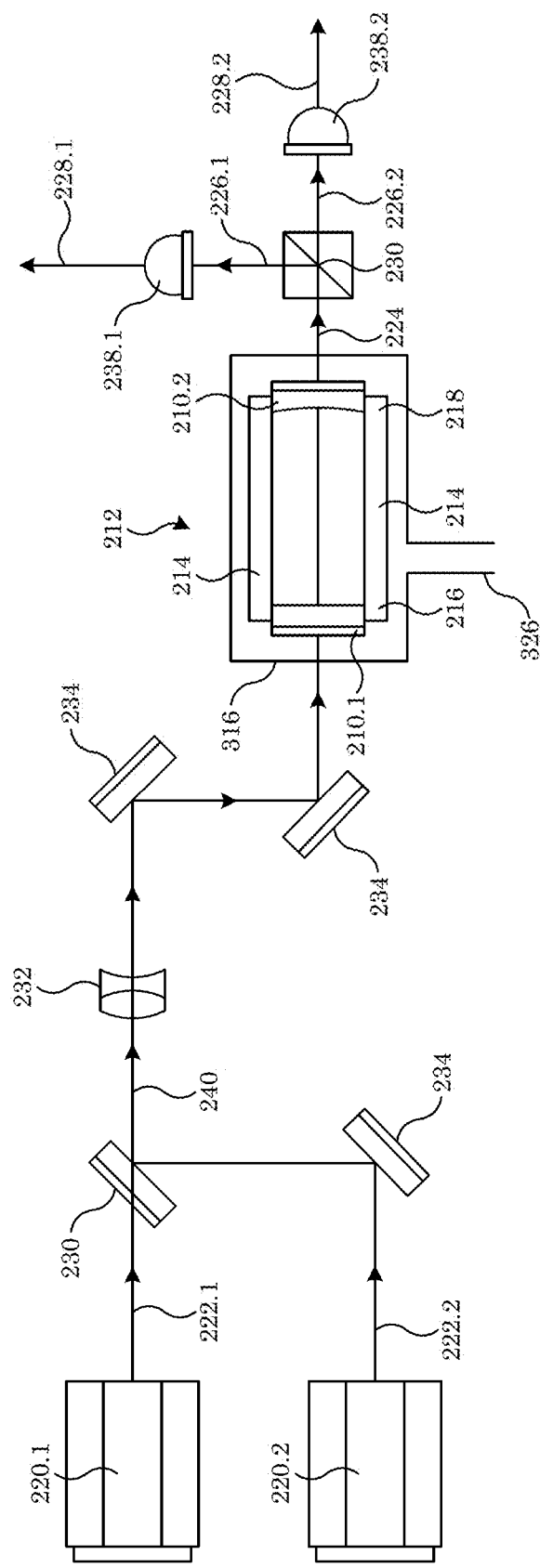
FIG. 1 shows a deformometer for determining deformation of an optical cavity optic.

In an embodiment, with reference to FIG. 1, deformometer 200 determines deformation of optical cavity optic 210 disposed on optical cavity 212 and includes optical cavity 212 including cavity body 214; entry optical cavity optic 210.1 disposed at entry end 216 of cavity body 214 and that receives combined light 240; and exit optical cavity optic 210.2 disposed at exit end 218 of cavity body 214, entry optical cavity optic 210.1 in optical communication and optically opposing exit optical cavity optic 210.2, such that exit optical cavity optic 210.2 receives combined light 240 from entry optical cavity optic 210.1, and optical cavity 212 produces filtered combined light 224 from combined light 240; first laser 220.1 in optical communication with entry optical cavity optic 210.1 and that provides first light 222.1; second laser 220.2 in optical communication with entry optical cavity optic 210.1 and that provides second light 222.2; optical combiner 230 in optical communication with entry optical cavity optic 210.1 and that: receives first light 222.1 from first laser 220.1; receives second light 222.2 from second laser 220.2; combines first light 222.1 and second light 222.2; produces combined light 240 from first light 222.1 and second light 222.2; and communicates combined light 240 to entry optical cavity optic 210.1; beam splitter 236 in optical communication with exit optical cavity optic 210.2 and that: receives filtered combined light 224 from optical cavity 212; splits filtered combined light 224 into first filtered light 226.1 and second filtered light 226.2; first light detector 238.1 in optical communication with beam splitter 236 and that: receives first filtered light 226.1 from beam splitter 236; and produces first cavity signal 228.1 from first filtered light 226.1; and second light detector 238.2 in optical communication with beam splitter 236 and that: receives second filtered light 226.2 from beam splitter 236; and produces second cavity signal 228.2 from second filtered light 226.2, from which a deformation of entry optical cavity optic 210.1 and exit optical cavity optic 210.2 is determined. Deformometer 200 can include lens 232 in optical communication with optical combiner 230 and that receives combined light 240 from optical combiner 230 and focuses the combined light 240. Deformometer 200 can include mirror 234 in optical communication with first laser 220.1 and second laser 220.2. It should be appreciated that although reference is made to determination of deformation of optical cavity optic 210 disposed on optical cavity 212, determination of deformation also includes determination of deformation of elements disposed on optical cavity optic 210 such as optical cavity 212.

Figure 2:
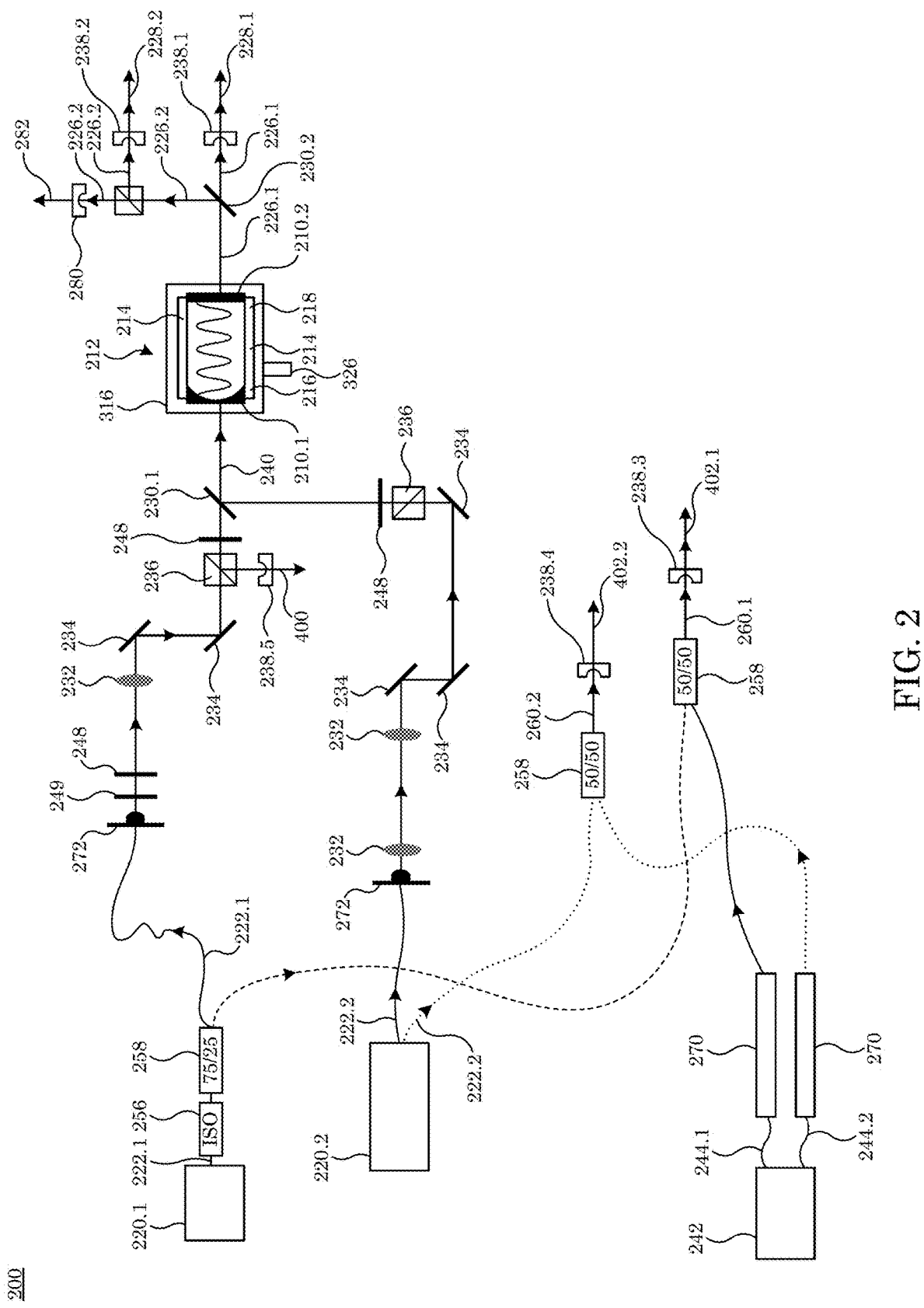
FIG. 2 shows a deformometer for determining deformation of an optical cavity optic.

In an embodiment, with reference to FIG. 2, deformometer 200 includes optical cavity 212. Optical cavity 212 includes cavity body 214; entry optical cavity optic 210.1 disposed at entry end 216 of cavity body 214 and that receives combined light 240; and exit optical cavity optic 210.2 disposed at exit end 218 of cavity body 214, wherein entry optical cavity optic 210.1 is in optical communication and optically opposes exit optical cavity optic 210.2. Exit optical cavity optic 210.2 receives combined light 240 from entry optical cavity optic 210.1, and optical cavity 212 produces filtered combined light 224 from combined light 240. First laser 220.1 is in optical communication with entry optical cavity optic 210.1 and provides first light 222.1. Second laser 220.2 is in optical communication with entry optical cavity optic 210.1 and provides second light 222.2. Deformometer 200 also includes first optical combiner 230.1 in optical communication with entry optical cavity optic 210.1 and that: receives first light 222.1 from first laser 220.1; receives second light 222.2 from second laser 220.2; combines first light 222.1 and second light 222.2; produces combined light 240 from first light 222.1 and second light 222.2; and communicates combined light 240 to entry optical cavity optic 210.1. Second optical combiner 230.2 is in optical communication with exit optical cavity optic 210.2 and receives filtered combined light 224 from optical cavity 212; splits filtered combined light 224 into first filtered light 226.1 and second filtered light 226.2. First light detector 238.1 is in optical communication with second optical combiner 230.2 and receives first filtered light 226.1 from second optical combiner 230.2; and produces first cavity signal 228.1 from first filtered light 226.1. Beam splitter 236 is in optical communication with second optical combiner 230.2 and receives second filtered light 226.2 from second optical combiner 230.2; communicates a portion of second filtered light 226.2 to imager 280; and communicates a second portion of second filtered light 226.2 to second light detector 238.2. Second light detector 238.2 is in optical communication with beam splitter 236 and receives second filtered light 226.2 from beam splitter 236; and produces second cavity signal 228.2 from second filtered light 226.2, from which a deformation of entry optical cavity optic 210.1 and exit optical cavity optic 210.2 is determined. Imager 280 is in optical communication with beam splitter 236 and receives second filtered light 226.2 from beam splitter 236; and produces image signal 282 from second filtered light 226.2. Deformometer 200 also includes optical frequency comb source 242 that produces first optical frequency comb 244.1 and second optical frequency comb 244.2; first reference light detector 238.3 that: receives first light 222.1 from first laser 220.1, receives first optical frequency comb 244.1 from optical frequency comb source 242, and produces first reference signal 402.1 from first light 222.1 and first optical frequency comb 244.11; and second reference light detector 238.3 that: receives second light 222.2 from the second laser 220.2, receives second optical frequency comb 244.2 from optical frequency comb source 242, and produces second reference signal 402.2 from second light 222.2 and second optical frequency comb 244.2. Deformometer 200 can include probe light detector 238.5 in optical communication with first laser 220.1 to receive first light 222.1 from first laser 220.1 and to produce probe signal 400 from first light 222.1. Optical isolator 256 can be in optical communication with laser 220.1 to optically isolate laser 220.1. Fiber coupler 258 can be included to optically split or couple multiple laser light beams, e.g., light 222.1, light 222.2, and the like. Coupling of propagation of light between free space and in fiber optics is provided by propagation coupler 272. Polarization filtering and control is provided by waveplate 248, polarizer 249, and the like. Collimation or focusing of light is provided by lens 232. Light is directed by mirror 234 and beam splitter 236. Filtering of light is provided by filter 270. Detection of light and conversion of light from an optical domain to an electrical domain is provided by light detector 238 and imager 280.

Figure 3:
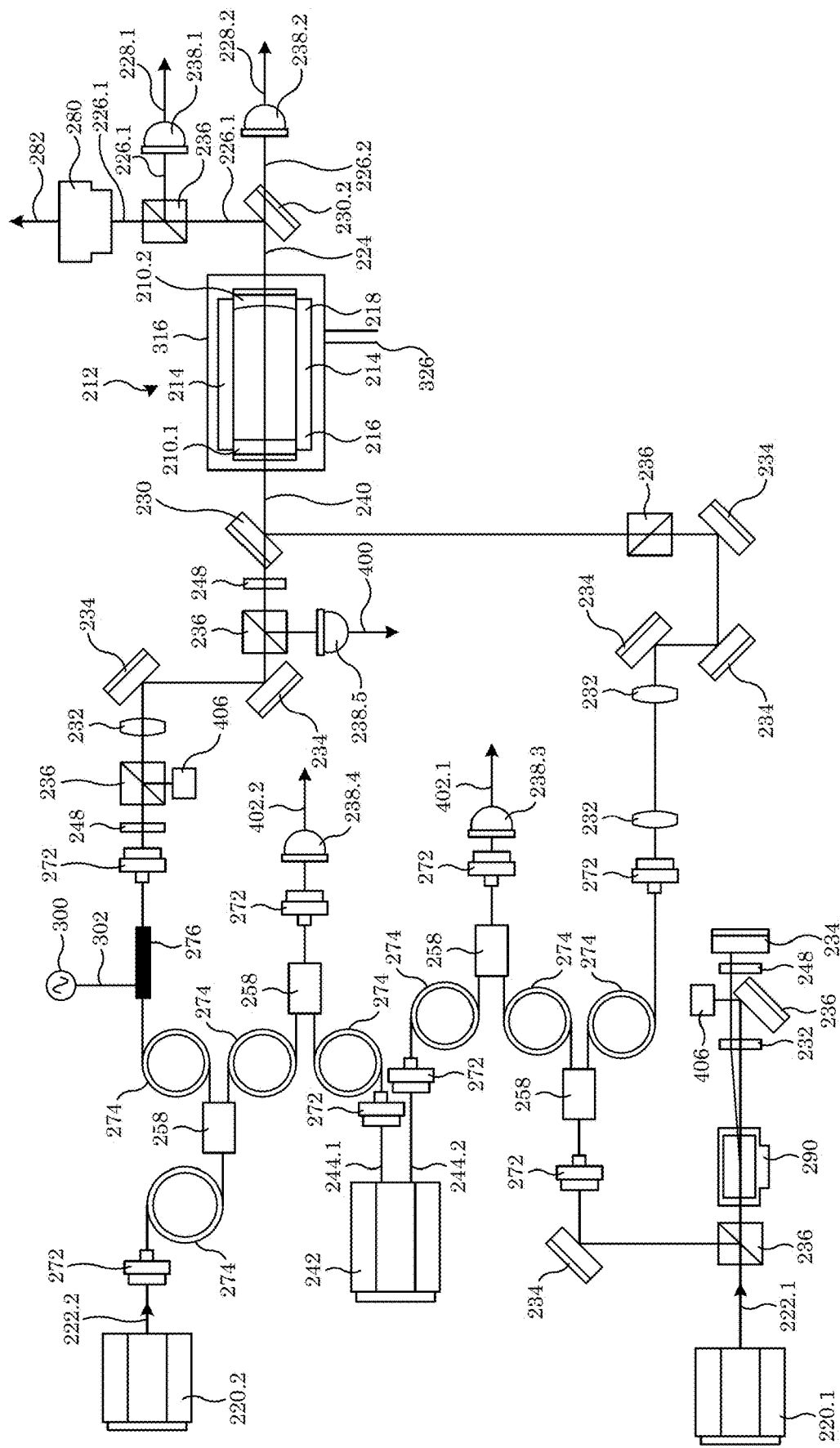
FIG. 3 shows a deformometer for determining deformation of an optical cavity optic.

In an embodiment, with reference to FIG. 3, deformometer 200 includes electrooptic modulator 276 in optical communication with first laser 220.1 that: receives first light 222.1 from first laser 220.1; receives oscillator signal 302 from oscillator 300; and modulates first light 222.1 at a frequency of oscillator signal 302. Electrooptic modulator 276 can be optically interposed between first laser 220.1 and first optical combiner 230.1. Amplitude optical modulator 290 can be in optical communication with second laser 220.2 to receive second light 222.2 from second laser 220.1 and to modulate second light 222.2. Amplitude optical modulator 290 can be optically interposed between second laser 220.2 and first optical combiner 230.1. It is contemplated that light can propagate through free space or in a condensed optical medium such as fiber optic 274.

Figure 4:
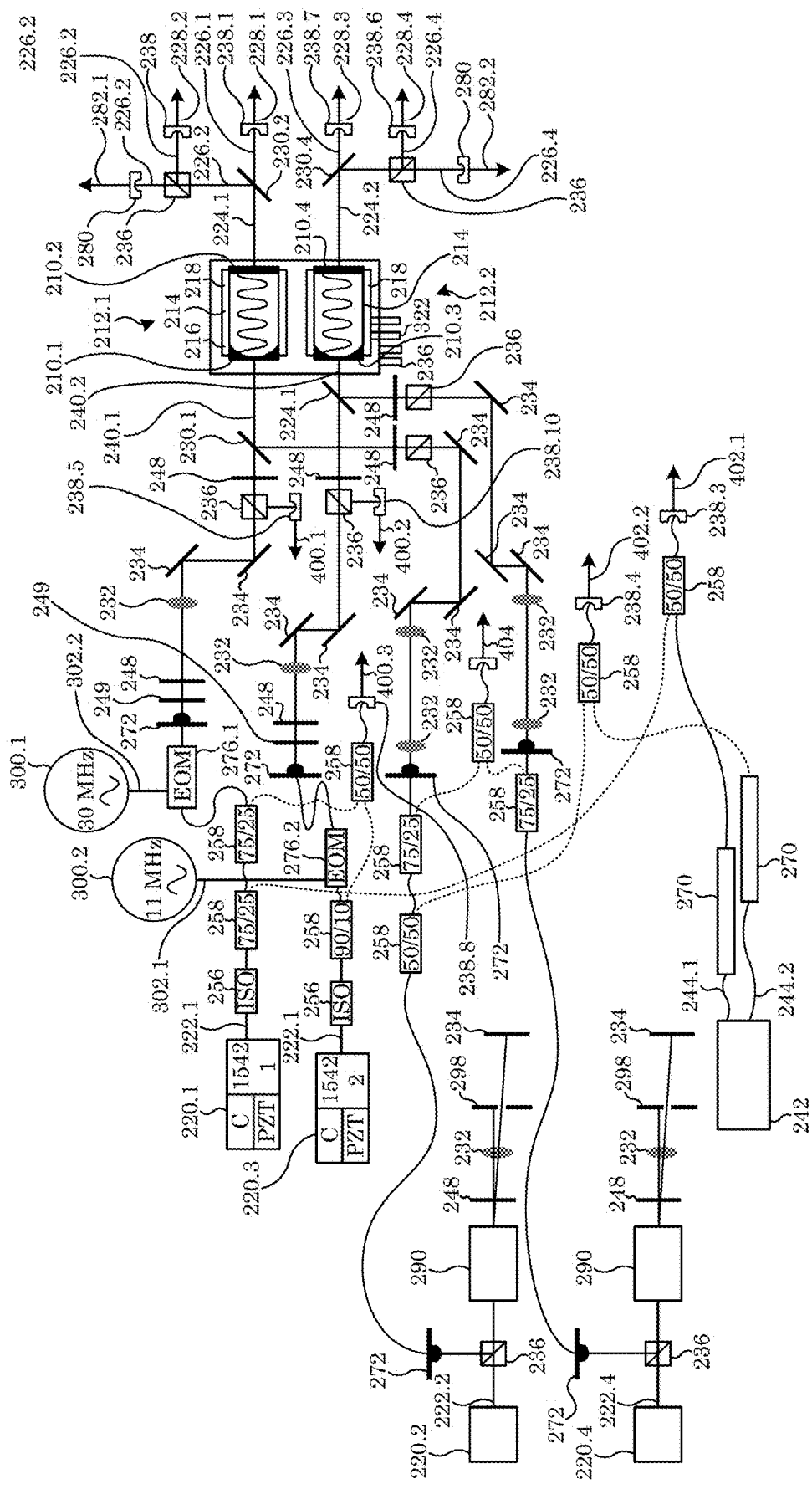
FIG. 4 shows a deformometer for determining deformation of an optical cavity optic.

In an embodiment, with reference to FIG. 4, deformometer 200 includes second optical cavity 212.2 that includes second entry optical cavity optic 210.3 disposed at entry end 216 of cavity body 214 and that receives second combined light 240.2; and second exit optical cavity optic 210.4 disposed at exit end 218 of cavity body 214. Second entry optical cavity optic 210.3 is in optical communication and optically opposes second exit optical cavity optic 210.4, wherein second exit optical cavity optic 210.4 receives second combined light 240.2 from second entry optical cavity optic 210.3, and second optical cavity 212.2 produces second filtered combined light 224.2 from second combined light 240.2. Third laser 220.3 is in optical communication with second entry optical cavity optic 210.3 and provides third light 222.3; fourth laser 220.4 is in optical communication with second entry optical cavity optic 210.3 and provides fourth light 222.4. Third optical combiner 230.3 is in optical communication with second entry optical cavity optic 210.3 and receives third light 222.3 from third laser 220.3, receives fourth light 222.4 from fourth laser 220.4, combines third light 222.3 and fourth light 222.4, produces second combined light 240.2 from third light 222.3 and fourth light 222.4, and communicates second combined light 240.2 to second entry optical cavity optic 210.3. Fourth optical combiner 230.4 is in optical communication with second exit optical cavity optic 210.4 and receives second filtered combined light 224.2 from optical cavity 212 and splits second filtered combined light 224.2 into third shifted light 226.3 and fourth shifted light 226.4. Third light detector 238.7 is in optical communication with fourth optical combiner 230.4, receives third shifted light 226.3 from fourth optical combiner 230.4, and produces third cavity signal 228.3 from third shifted light 226.3. Second beam splitter 236 is in optical communication with fourth optical combiner 230.4, receives fourth shifted light 226.4 from fourth optical combiner 230.4, communicates a portion of fourth shifted light 226.4 to second imager 280, and communicates a second portion of fourth shifted light 226.4 to sixth light detector 238.6. Sixth light detector 238.6 is in optical communication with second beam splitter 236, receives fourth shifted light 226.4 from second beam splitter 236, and produces fourth cavity signal 228.4 from fourth shifted light 226.4, from which a deformation of second entry optical cavity optic 210.2 and second exit optical cavity optic 210.4 is determined. Second imager 280 is in optical communication with second beam splitter 236, receives fourth shifted light 226.4 from second beam splitter 236, and produces second image signal 282.2 from fourth shifted light 226.4.

Second probe light detector 238.10 is in optical communication with third laser 220.3, receives third light 222.3 from third laser 220.3, and produces second probe signal 400.2 from third light 222.3. Second reference light detector 238.9 is in optical communication with second laser 220.2 and fourth laser 220.4, receives second light 222.2 from second laser 220.2, receives fourth light 222.4 from fourth laser 220.4, and produces mixed optical signal 404 from second light 222.2 and fourth light 222.4. Third probe light detector 238.8 is in optical communication with first laser 220.1 and second laser 220.2, receives first light 222.1 from first laser 220.1, receives third light 222.3 from third laser 220.3, and produces third probe signal 400.3 from first light 222.1 and third light 222.3.

Figure 5:
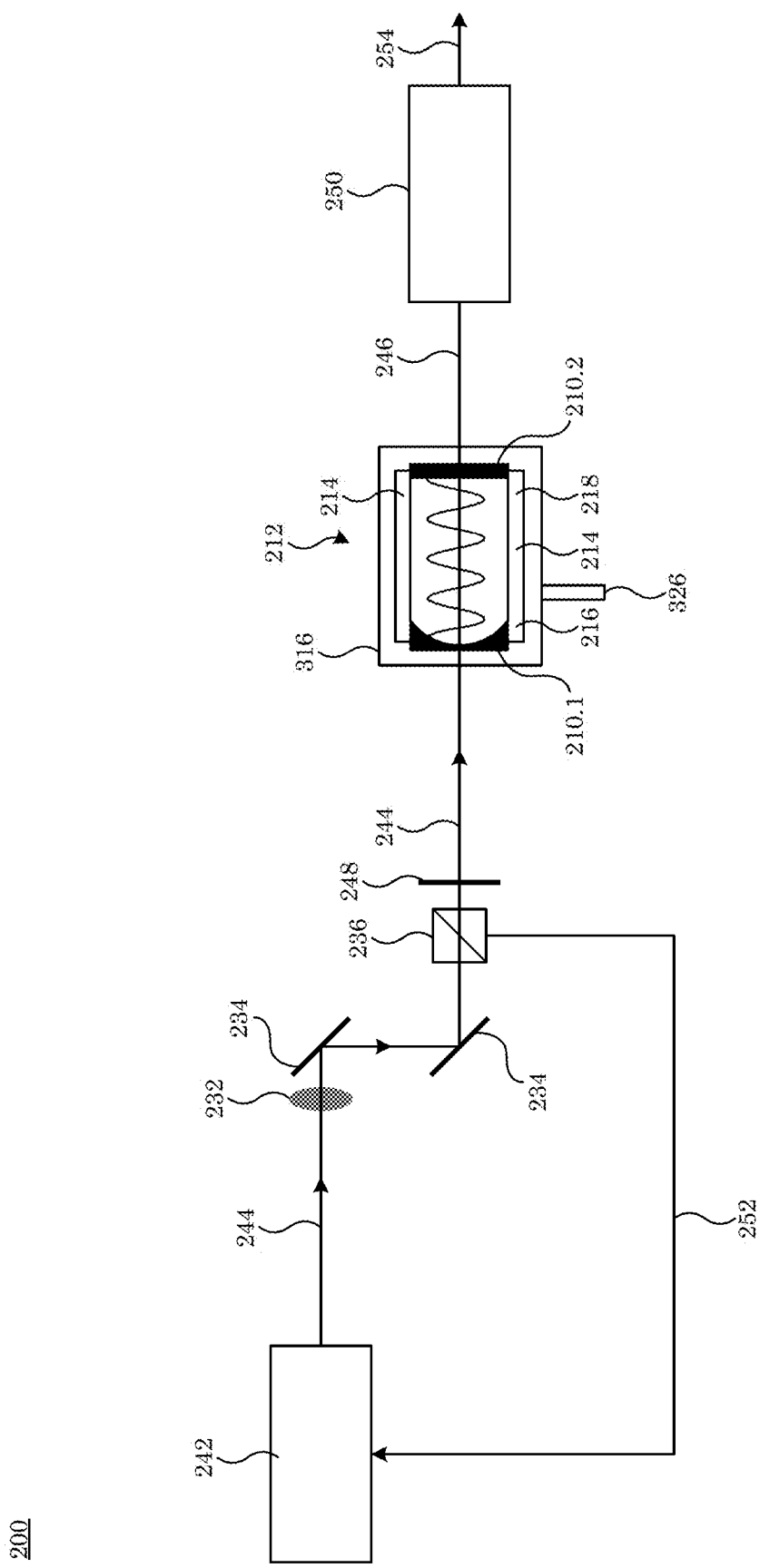
FIG. 5 shows a deformometer for determining deformation of an optical cavity optic.

In an embodiment, with reference to FIG. 5, deformometer 200 includes first optical cavity 212.1 that includes first cavity body 214.1; first entry optical cavity optic 210.1 disposed at entry end 216 of first cavity body 214.1 and that receives optical frequency comb 244; and first exit optical cavity optic 210.2 disposed at exit end 218 of first cavity body 214.1. First entry optical cavity optic 210.1 is in optical communication and optically opposes first exit optical cavity optic 210.2, wherein first exit optical cavity optic 210.2 receives combined light 240 from first entry optical cavity optic 210.1, and first optical cavity 212.1 produces shifted frequency light 246 from combined light 240. Optical frequency comb source 242 is in optical communication with first entry optical cavity optic 210.1 and provides optical frequency comb 244. Beam splitter 236 is in optical communication with first entry optical cavity optic 210.1, receives optical frequency comb 244 from optical frequency comb source 242, splits a portion of optical frequency comb 244 to produce feedback light 252, and communicates feedback light 252 to optical frequency comb source 242 as feedback control for optical frequency comb source 242. Fourier transform spectrometer 250 is in optical communication with optical cavity 212, receives shifted frequency light 246 from optical cavity 212, and produces deformation signal 254 from shifted frequency light 246 from which a deformation of optical cavity optic 210.1 and first exit optical cavity optic 210.2 is determined. Waveplate 248 is in optical communication with optical cavity 212, optically interposed between optical frequency comb source 242 and optical cavity 212, and controls a polarization of optical frequency comb 244 received by optical cavity 212.

Figure 6:
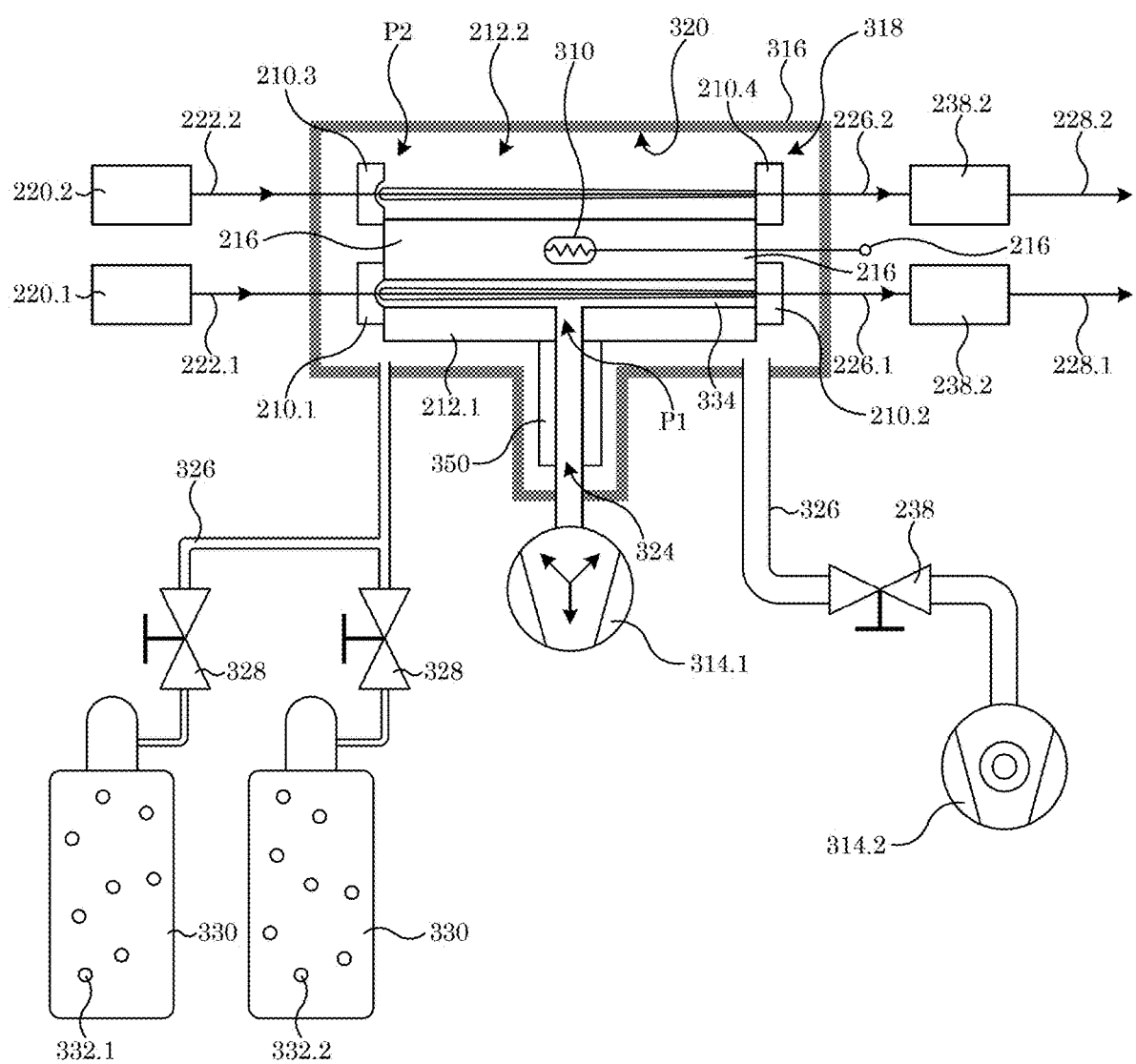
FIG. 6 shows a deformometer for determining deformation of an optical cavity optic.

In an embodiment, with reference to FIG. 6, deformometer 200 includes first optical cavity 212.1 that includes cavity body 214; first entry optical cavity optic 210.1 disposed at entry end 216 of cavity body 214.1; and first exit optical cavity optic 210.2 disposed at exit end 218 of cavity body 214. First entry optical cavity optic 210.1 is in optical communication and optically opposes first exit optical cavity optic 210.2. First optical cavity 212.1 receives reference gas 334 at first pressure P1, receives first light 222.1, and produces first filtered light 226.1 from first light 222.1. Second optical cavity 212.2 includes second entry optical cavity optic 210.3 disposed at entry end 216 of cavity body 214; and second exit optical cavity optic 210.4 disposed at exit end 218 of cavity body 214. Second entry optical cavity optic 210.3 is in optical communication and optically opposes second exit optical cavity optic 210.3. Second optical cavity 212.2 receives second gas 332 at second pressure P2, receives second light 222.1, and produces second filtered light 226.2 from second light 222.2. Gas source 330 is in fluid communication with second optical cavity 212.2 and provides second gas 332 to second optical cavity 212.2. Second pump 314.2 is in fluid communication with optical cavity 212.2 to pump second gas 332 from optical cavity 212.2. First pump 314.1 is in fluid communication with first optical cavity 212.1 to obtain a selected pressure thereof at first pressure P1 via pump stem 350 of optical cavity 212 connected to first optical cavity 212.1 and that provides wall 322 that bounds flow channel 324 through reference gas 334 flows to pump 314.1. First laser 220.1 is in optical communication with first optical cavity 212.1 and provides first light 222.1 to first optical cavity 212.1. Second laser 220.2 is in optical communication with second optical cavity 212.2 and provides second light 222.2 to second optical cavity 212.2. Deformation of first optical cavity optic 210.1, second optical cavity optic 210.2, third optical cavity optic 210.3, and fourth optical cavity optic 210.4 is determined from first cavity signal 228.1 and second cavity signal 228.2. Valves 328 throttle and isolate gas source 330 and pump 314.

Figure 7:
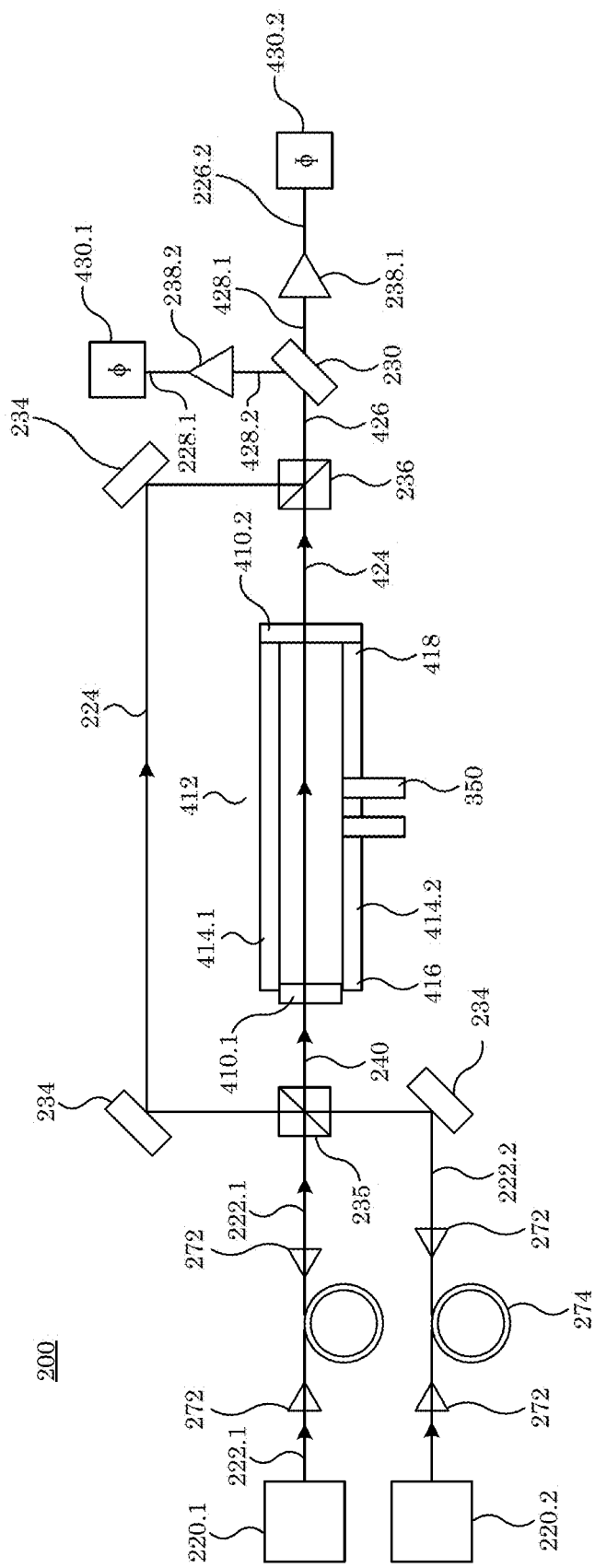
FIG. 7 shows a deformometer for determining deformation of an optical cavity optic.
Figure 8:
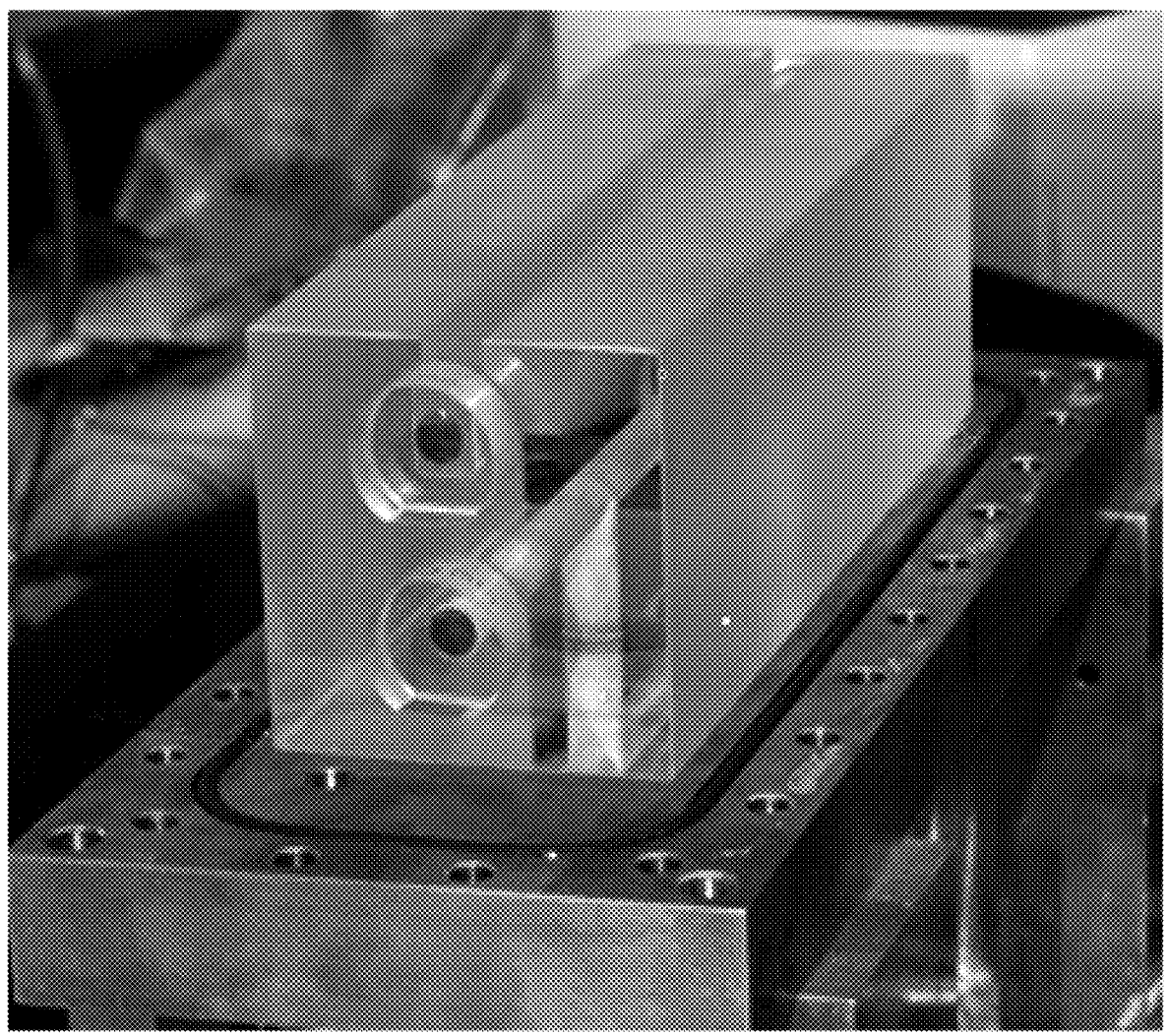
FIG. 8 shows an optical cavity.

In an embodiment, with reference to FIG. 7, deformometer 200 determines deformation of optical cavity optic 410 disposed on optical cell 412 and includes optical cell 412 including cell body 414; entry optical cell optic 410.1 disposed at entry end 416 of cell body 414 and that receives combined light 240; and exit optical cavity optic 410.2 disposed at exit end 418 of cell body 414, entry optical cavity optic 410.1 in optical communication and optically opposing exit optical cavity optic 410.2, such that exit optical cell optic 410.2 receives combined light 240 from entry optical cavity optic 410.1, and optical cell 414 produces shifted combined light 424 from combined light 240; first laser 220.1 in optical communication with entry optical cavity optic 410.1 and that provides first light 222.1; second laser 220.2 in optical communication with entry optical cavity optic 410.1 and that provides second light 222.2; propagation coupler 272 in optical communication with first laser 220.1; beam splitter 236 that receives first light 222.1 and second light 222.2 before communication into optical cell 412; second beam splitter 236 to receive filtered combined light 224 and shifted combined light 424 from optical cell 412; optical combiner 230 that splits filtered light 426 received from second beam splitter 236 and to produce first cavity signal 428.1 and second cavity signal 428.2; first light detector 238.1 that receives first cavity signal 428.1 and produces second filtered light 226.2; second phase detector 430.2 that receives second filtered light 226.2 from first light detector 238.1; second light detector 238.2 that receives second cavity signal 428.2 from optical combiner 230 and produces first cavity signal 228.1; and first phase detector 430.1 that receives first cavity signal 228.1 from second light detector 238.2.

In deformometer 200, optical cavity optic 210 can include a concave, convex, or flat mirror to provide first entry of light into the cavity and reflection of light to create an optical resonator. Exemplary optical cavity optic 210 includes a concave dielectric mirror that is anti-reflective coated on the input and highly reflective on the inside. The reflection of optical cavity optic 210 can be from 0.1 to 1.0, specifically from 0.9 to 1.0, and more specifically from 0.999 to 1.0 at a wavelength from the ultraviolet (UV) to infrared (IR), specifically at any two wavelengths within that range. Moreover, the shapes of cavity optic 210 provide stable optical resonance with no overlapping modes.

In deformometer 200, cavity body 214 can include a tube to mechanically define the optical cavity and can be rectangular parallelepiped glass with a smooth cylindrical bore. Moreover, cavity body 214 can have an opening for gas from the surrounding pressure vessel 316 to enter the space between cavity optic 210. A size (e.g., a longest linear dimension) of cavity body 214 can be from 1 mm to 10 m, specifically from 1 cm to 100 cm, and more specifically from 2 cm to 10 cm. A coefficient of thermal expansion of cavity body 214 can be from 0 to $10^{-4}$, specifically from 0 to $10^{-6}$, and more specifically from 0 to $10^{-8}$. In an embodiment, cavity body 214 is made from ultra-low expansion glass in a rectangular parallelepiped shape, with cylindrical bores on the ends to secure cavity optic 210 and a slit along one side to allow for the penetration of gas.

In deformometer 200, laser 220 (e.g., laser 220.1, laser 220.2, laser 220.3, laser 220.4) can be a laser source that produces laser light which is resonant or nearly resonant with the cavity, including a HeNe laser, Ti: Sapphire laser, external-cavity diode lasers, and the like. Exemplary laser 220 includes an infrared external cavity diode laser. Moreover, the laser linewidth can be smaller than the free spectral range of the cavity defined by cavity optic 210. In an embodiment, laser 220 includes a HeNe laser and an infrared external cavity diode laser.

In deformometer 200, light 222 (e.g., light 222.1, light 222.2, light 222.3, light 222.4) can include a single-frequency laser light used to probe the cavity resonances. Exemplary light 222 includes light from a HeNe laser. A wavelength of light 222 can be from UV to IR, specifically from 250 nm to 2 um, and more specifically can be a wavelength defined by cavity optic 210. Moreover, the frequency spectrum of light 222 can have a single frequency peak. A power of light 222 can be from 1 uW to 1 W, specifically from 10 uW to 100 mW, and more specifically from 100 uW to 10 mW. When in optical communication with cavity 212, the wavelength can correspond to a transmitted wavelength of cavity 212 and a linewidth smaller than that of the cavity defined by cavity optic 210. When in optical communication with optical cell 412, the wavelength can correspond to a transmitted wavelength of cell 412, and the linewidth can be smaller than the speed of light divided by the optical path length from the source 220 to detector 238. Exemplary beam waists are 1 mm, and duty cycle is one. In an embodiment, light 222.1 and 222.2 have wavelength 1542 nm, 10 mW power, 2 kHz linewidth. In an embodiment, light 222.3 and 222.4 have wavelength 633 nm, 1 mW power, 10 kHz linewidth.

In deformometer 200, filtered combined light 224 and filtered light 226 include light that transmits the cavity.

In deformometer 200, cavity signal 228 can include any signal used to determine if light 222 has the same frequency as light 224. In an embodiment, e.g., as shown in FIG. 1, cavity signal 228 is the frequency of the light. In an embodiment, e.g., as shown in FIGS. 2-4, cavity signal 228 is the intensity or power of the transmitted light.

In deformometer 200, optical combiner 230 can include a dichroic mirror, plate beam splitter, cube beam splitter, or partially reflective mirror to merge light 222 (e.g., light 222.1, light 222.2, light 222.3, light 222.4) or to align the light to travel along the same path. Moreover, in reverse, the optical combiner can split In deformometer 200, mirror 234 is a mirror that reflects light 222 (e.g., light 222.1, light 222.2, light 222.3, light 222.4). Exemplary mirrors include dichroic mirrors, dielectric mirrors or metallic mirrors.

In deformometer 200, beam splitter 235 can include an optic that splits the incoming beam power equally, with half of the power continuing along the original direction and half of the power travelling orthogonally. Exemplary beam splitter are plate 50/50 beam splitters or 50/50 cube beam splitters.

In deformometer 200, polarizing beam splitter 236 can include an optic that splits the incoming beam power according to its polarization state, with orthogonal linear polarizations traveling orthogonally to each other. Exemplary polarizing beam splitter are polarizing beam splitting cubes and Glan-Laser calcite polarizers.

In deformometer 200, light frequency detector 237 transduces the frequency or wavelength of filtered light 226.

In deformometer 200, light detector 238 can include a detector that transduces the power of filtered light 226 into cavity signal 228. The bandwidth of the photodetectors can be between 0 Hz and 10 GHz, specifically between 0 and the frequency of the free spectral range define by cavity 212. Exemplary light detectors include power meters and photodiodes, photoreceivers.

In deformometer 200, combined light 240 can include laser light 222, but each (222.1, 222.2, 222.3, etc.) with its own distinct wavelengths, colors, or frequencies. Exemplary combined light 240 includes light from multiple single frequency laser sources (220) combined together using optical combiners (230) or light from a frequency comb source (242).

In deformometer 200, optical frequency comb source 242 can include a laser source that produces multiple laser light 222 spaced equally in frequency space such that each frequency can probe the cavity. Exemplary optical frequency comb sources can be a phase-stabilized femtosecond pulse laser or phase-modulated continuous wave laser light.

In deformometer 200, optical frequency comb 244 can include multiple laser light 222 spaced equally in frequency space such that each frequency can probe the cavity. Moreover, optical frequency comb 244 is a specific example of combined light 240, where the wavelength components of combined light 240 have equal separation in frequency.

In deformometer 200, filtered frequency comb light 246 is product of the input light and filter function that is filtered by cavity optics 210.

In deformometer 200, waveplate 248 and polarizer 249 can include an optic to manipulate a polarization of light 222 and combined light 240. Exemplary waveplates and polarizers include birefringent crystals and calcite polarizers.

In deformometer 200, Fourier transform spectrometer 250 can include any device that determines the transmission each component of the filtered frequency comb light 244. Exemplars include a Michelson interferometer, or second comb with shifted repetition rate or etalon, diffraction grating, CCD camera, and the like. An output from the Fourier transform spectrometer 250 is a transmission spectrum of cavity 212.

In deformometer 200, feedback light 252 is a sample of the frequency comb light for measurement of an absolute frequency of a frequency component of frequency comb 200.

In deformometer 200, optical isolator 256 can include an optic that prevents the transmission of light in one direction but not the other. Exemplary optical isolators are Faraday effect isolators.

In deformometer 200, fiber coupler 258 can include an optic that couples light from air to a condensed matter medium. The efficiency of the coupling can be from 0.1 to 1, specifically from 0.5 to 1.0. Exemplary fiber couplers 258 include fiber-to-free space couplers In deformometer 200, fiber optic 274 is a condensed-matter medium that propagates light. Exemplary fiber optics include single-mode fiber optical cable, polarization-maintaining single-mode fiber optical cable, and the like.

In deformometer 200, fiber optic power splitter 258 is a condensed-matter medium that splits light. Exemplary fiber optics include single-mode fiber optical cable, polarization-maintaining single-mode fiber optical cable, and the like.

In deformometer 200, propagation coupler 272 can include an optic that couples light from air to a condensed matter medium. The efficiency of the coupling can be from 0.1 to 1, and specifically from 0.5 to 1.0. Exemplary fiber couplers include aspheric lenses, achromatic lenses, parabolic mirror couplers, and the like.

In deformometer 200, reference light 260 is a combination of light 222 and optical frequency comb 244 used to measure the frequency of light 222 relative to frequency comb 244 through beat note detection on high speed optical detector 238, e.g., a photoreceiver.

In deformometer 200, bandpass filter 270 filters frequency comb light 244 to eliminate frequency components outside a certain range. The filter bandwidth can be from 0.001 nm to 1500 nm, more specifically from 1 nm and 2 nm.

In deformometer 200, electrooptic modulator 276 can include a fiber-based electrooptic crystal driven to phase modulate light travelling through the fiber. Phase modulation depths generated by electrooptic modulator 276 can be from 0.01 to 0.1.

In deformometer 200, imager 280 can include a camera or charge-coupled device (CCD) that produces image signal 282 that can include a picture or movie of filtered, combined light 240 to ensure that the spatial mode matches the fundamental spatial mode of the cavity 212.

In deformometer 200, acoustic optical modulator 290, in combination with lens 232, mirror 234, waveplate 236, polarizing beam splitter 236, beam dump 406m or iris 298, shifts the single frequency of an otherwise fixed frequency laser. Light 222 incident on polarizing beam splitter 236 transmits through, incident upon the acousto-optic modulator, which produces several frequency shifted beams spatially separated and that are spatially filtered using a mirror and beam dump or iris. A selected frequency shifted beam transmitted by a lens 232 that redirects its direction parallel to the input beam 222.1 and focuses through waveplate 248 onto mirror 234, the reflection from which retransmits to waveplate 248. The combined effect of which rotates polarization by 90 degrees and retransmits to the lens and the acousto-optic modulator, which imparts a second frequency shift to the beam and directs this second frequency shifted beam along the same axis but opposite direction of the input beam.

In deformometer 200, oscillator 300 produces oscillating electrical signal 302 for electrooptic modulator 276. The electrical signal frequency is within a range of operation of the electrooptic modulator, and the power is within the range of operation of the electrooptic modulator.

In deformometer 200, heater 310 can include a resistive heater to stabilize a temperature of cavity 212. Electrical connection to the resistive heater is made through signal coupler 312.

In deformometer 200, pump 314 can include a pump to evacuate the gas from the chamber. A base pressure range of pump 314 can be, e.g., from $10^{-6}$ Pa to $10^{-1}$ Pa.

In deformometer 200, chamber 316 and its walls 320 encloses the chamber interior 318 such that gasses injected into 318 are confined. Moreover, chamber 316 allows for the insertion of light into the optical cavities 212. Chamber 316 can be a copper box with vacuum-compatible glass viewports, which are anti-reflective coated and wedged to minimize back reflection. For optimum performance, chamber 316 can have a leak rates less than 1 µPa L/s.

In deformometer 200, stem 350 provides structural support and mount for cavity 212. In an embodiment, it is a ULE glass tube bonded to body 212 by silicate bonding.

In deformometer 200, flow channel 324 can include a channel that allows the flow of gas into or out of chamber 316. Exemplary flow channels include stainless steel tubing, copper tubing, and the like. In an embodiment, a leak rate of flow channel 324 are not greater than a leak rate of chamber 316.

In deformometer 200, gas line 326 can include plumbing that conducts gas from the gas source 330 to the chamber 316. Exemplary gas lines include stainless steel tubing.

In deformometer 200, valve 328 can include a mechanism such as a valve that stops flow of gas past it. Exemplary valves include metal seal valves, gate valves, ball valves with rubber seals, and the like.

In deformometer 200, gas source 330 provides a source of gas 332 and can be a gas tank, gas production unit, and the like.

In deformometer 200, reference gas 334 can include a gas at constant pressure throughout the measurement. Exemplary reference gasses include vacuum, helium, nitrogen, argon, neon, krypton, dry air, and the like. In an embodiment, reference gas 334 is air at a pressure that is, e.g., less than $10^{-4}$ Pa.

In deformometer 200, probe signal 400 can include a Pound-Drever-Hall signal used as feedback on the output of laser 220 to make laser light 222 resonant within optical cavity 200?

In deformometer 200, reference signal 402 can include an oscillating signal between optical frequency comb 244 and light 222, allowing for absolute measurement of the frequency of light 222.

In deformometer 200, mixed optical signal 404 can include an oscillating signal whose frequency of oscillation is determined by the difference frequency of the two components of light 222 that compose it.

In deformometer 200, beam dump 406 can include an object that absorbs laser light such as a blackened screen, Wood's horn, and the like.

In deformometer 200, first pressure P1 and second pressure P2 are the pressures at which gas species 332.1 and 332.2 are inserted in the pressure chamber 316.

In deformometer 200, optical cell optic 410 can include an optically transmissive material that transmits both components of combined light 240 and shifted combined light 424. Exemplary elements include sapphire windows, Pyrex windows, and the like. Moreover, the windows can be mounted normally or at angle, with specific benefit being Brewster's angle to minimize reflection.

In deformometer 200, cell body 414 can include mechanical object that attaches optical cell optic 410, provides for an opening for gas line 326, and holds gas inserted. The pressure contained in the cell can be from 0 to 10 MPa, specifically from 1 kPa to 10 MPa, and more specifically from 100 kPa to 3.6 MPa. Cell body 414 can have a leak rates that is less than 1 mPa L/s.

In deformometer 200, shifted combined light 424 is light that has been phase-shifted by the presence of the gas in cell 414.

In deformometer 200, interfered combined light 426 is a combination of interfered light 428, each of which is itself a product of optical mixing between the individual wavelength components of combined light 242 and shifted combined light 424. Interfered light 428 is zero when the phase difference of its components in 242 and 424 have a relative phase shift of $\pi$ (or an odd multiple thereof) and maximal intensity when its components in 242 and 424 have a relative phase shift of 0 or $2\pi$ (or any even multiple thereof).

In deformometer 200, phase detector 412 is a detector the measures the phase change of shifted combined light 424 due to the insertion of gas by analyzing the signal from photodetector 238 and comparing it relative to the maximum signal. Specifically, it takes the inverse sine function of the intensity of the light 428 relative to the maximum possible value.

Deformometer 200 can be made in various ways. In an embodiment, a process for making deformometer 200 includes: disposing optical cavity 212 in chamber 316 that provides chamber interior 318 bounded by wall 320; disposing laser 220 in optical communication with optical cavity optic 210; optionally interposing lens 232, optical isolator 256, fiber coupler 258, propagation coupler 272, filter 270, polarizer 249, waveplate 248, mirror 234, beam splitter 236, optical combiner 230, fiber optic 274, electrooptic modulator 276, or amplitude optical modulator 290 between laser 220 and optical cavity optic 210; disposing cavity signal 228 in optical communication with optical cavity optic 210; and optionally disposing beam splitter 236 or optical combiner 230 between optical cavity optic 210 and light detector 238 or imager 280. The process can include aligning laser 220 with optical cavity 212 and light detector 238. The process can include connecting optical cavity optic 210 or wall 320 to a gas handling system such that gas source 330 and pump 314 are disposed in communication with various elements, and a pressure monitoring system can monitor pressure thereof.

Deformometer 200 has numerous advantageous and unexpected benefits and uses. In an embodiment, a process for determining deformation of optical cavity optic 210 disposed on optical cavity 212 with deformometer 200 includes combining first light 222.1 with second light 222.2; producing combined light 240 from first light 222.1 and second light 222.2; receiving, by entry optical cavity optic 210.1 disposed at an entry end 216 of a cavity body 214 of a deformometer 200, combined light 240; transmitting, from first optical cavity optic 210.1 to exit optical cavity optic 210.2 disposed at exit end 218 of cavity body 214, combined light 240, entry optical cavity optic 210.1 being in optical communication and optically opposing exit optical cavity optic 210.2; receiving, by exit optical cavity optic 210.2, combined light 240; producing filtered combined light 224 from combined light 240 transmitted by first optical cavity optic 210.1 and second optical cavity optic 210.2; producing, from filtered combined light 224, first filtered light 226.1 and second filtered light 226.2; and analyzing first filtered light 226.1 and second filtered light 226.2 to determine deformation of entry optical cavity optic 210.1 and exit optical cavity optic 210.2. Here, analyzing first filtered light 226.1 and second filtered light 226.2 includes determining the frequency of the first filtered light and second filtered light.

The process for determining deformation with the deformometer 200 includes determining the frequency shift of the cavity upon insertion of gas. Upon disposal of gas in optical cavity 212, the frequency shift of a Fabry-Perot cavity is $$n_i(p, \lambda) - 1 = f_{FSR}(1 + \epsilon_\alpha) \frac{\frac{(f_i - f_f)}{f_{FSR}} + \Delta m}{f_f} + nd_M \quad (1)$$

wherein $n_i(p,\lambda)$ is the index of refraction of gas species i, assumed to be known for a given pressure p and wavelength $\lambda$; $f_{FSR}$ is the free spectral range of the cavity; $\epsilon_\alpha$ is the dispersion of the mirrors, $d_m$ deformation due to the mirrors; $f_i$ and $f_f$ are the initial (vacuum) and final (pressurized) frequencies; $\Delta m$ is the change in cavity mode number, and $d_M$ is the deformation of the cavity due to the change in pressure. The effective fractional frequency change follows.

$$\left(\frac{\Delta f}{f}\right)_{eff} = f_{FSR}(1 + \epsilon_\alpha) \frac{\frac{(f_i - f_f)}{f_{FSR}} + \Delta m}{f_f}$$

The effective fractional frequency change simplifies Eq. 1 to $$n_i(p, \lambda) - 1 = \left(\frac{\Delta f}{f}\right)_{eff} + nd_M \quad (2)$$

Deformometer 200 can include lasers that provide different wavelengths of light to interrogate the index of refraction of a gas in optical cavity 212. If the dispersion of the gas is known, multiple measurements are used to determine deformation of optical cavity 212 in an absence of any outside assumptions or calculations about the material properties of optical cavity 212. In an embodiment, optical cavity 212 is filled with gas; two or more lasers 220 providing light 222 at different wavelengths. Lights 222 advantageously are well-separated in wavelength. A gas handling system provides and communicates a purified gases into optical cavity 212, and gases can be evacuated from optical cavity 212. A pressure monitoring system monitors constancy of pressure in optical cavity 212. This system need not measure the pressure absolutely. An optical frequency detector monitors optical cavities and optical elements and measure a frequency shift thereof upon disposal of gas into optical cavity 212.

$$n_i(p, \lambda_1) - n_i(p, \lambda_2) = \left(\frac{\Delta f}{f}\right)_{eff,1} - \left(\frac{\Delta f}{f}\right)_{eff,2}$$

where $$\left(\frac{\Delta f}{f}\right)_{eff,i}$$

is the effective frequency shift measured at wavelength $\lambda_i$. Addition of the two effective frequencies provides deformation of optical cavity 212. Subsequently, after deformation is measured the measurement of properties of the gas inside optical cavity 212 become primary measurements.

In an embodiment, with respect to FIG. 1, the frequency shift is measured directly using the frequency detectors 237. The frequency shift can be measured relative to a stable reference frequency via mixing of the optical signals on light detector 238. The reference can include a frequency comb, a second, independent reference cavity, the reference cavity on a fixed-length optical cavity (FLOC), a wavelength meter, and the like.

In an embodiment, with respect to FIG. 2, replace the optical frequency detectors 237 by light detectors 238. The light detectors are used in feedback to lasers 220 to ensure that combined light 240 equals combined filtered output light 224 when gas is inserted and removed from optical cavity 212. Frequency shift of light 240 of the laser light 222 are then measured using frequency comb light 242 as a reference by measuring beat frequencies between frequency comb light 242 and laser light 222 as detected on optical power detector 238. In this case, the frequency reference against which all frequencies are measured is the frequency comb 224.

In an embodiment, with reference to FIG. 3, include a HeNe laser 220.1 producing laser light 222.1 at wavelength 633 nm and external cavity diode laser 220.2. Electro-optic modulator 276 produces two frequency sidebands on light 222.2 that are reflected from cavity optic 212 and, after reflecting from beam splitter 236 are detected by photoreceiver 238.5 and are used in feedback to laser 220.2 to ensure that 222.2 and 226.2 are equal. Likewise, light detector 228 monitors the transmission of light 222.1 through the cavity to ensure that 226.2 equals to 222.1. Feedback is employed on the temperature of laser 220.1 and through an acousto-optic modulator 290 to shift the frequency of laser light 222.1 in order to ensure that 222.1 is equal to the resonant mode of the cavity. In this case, the frequency reference against which all frequencies are measured is the frequency comb 224.

In an embodiment, with reference to FIG. 4, fixed-length optical cavity (FLOC) has reference cavity 212.2 interrogated by laser light 222.3 and 222.4 from lasers 220.3 and 220.4, respectively. The frequency of light from 220.3 and 220.4 does not deviate from 220.1 and 220.2, respectively, by more than the bandwidth of light detector 238. These lasers have their light equal to the filtered cavity light on the output of the reference cavity of the FLOC. These lasers then become the frequency reference for lasers 220.1 and 220.2, and the frequency shifts are measured with respect to these by detecting the difference frequency via optical mixing on light detectors 238.8 and 238.9.

Having more than two wavelengths probing the cavity is advantageous, as it provides additional information regarding the deformation. In an embodiment, with reference to FIG. 5, an optical frequency comb 244 replaces the individual laser sources 222. The comb with frequency component spacing considerably less than or equal the optical cavity mode spacing can be used to interrogate the cavity at vacuum and with gas. The reference signal 252 is used to control the absolute frequency of the comb and the relative of frequency components. The comb is scanned and the transmission of the comb through the cavity is measured using the Fourier transform spectrometer 250. The relative spacing of the cavity peaks determines the cavity dispersion of the cavity when no gas is present. After injection, the relative spacing of the cavity peaks is determined by the sum of the dispersion of the cavity, the dispersion of the gas, and the deformation. If the dispersion of the gas is known and the dispersion of the cavity is measured, the deformation is measured by subtraction of the gas and cavity dispersion.

In an embodiment, with reference to FIG. 6, a fixed-length optical cavity (FLOC) 212 that receives two gases, e.g., He and N2, and a HeNe laser at 633 nm. The frequency reference for the FLOC was the FLOC's reference cavity and the mode of detection for the frequency shift was beat-note detection. FLOC 212 is a Fabry-Perot cavity. Both gases experience the same deformation, by subtracting the two one cancels the deformation and instead measures the difference between the index of refraction of the two gases as provided in the following equation.

$$(n-1)_{He} - (n-1)_{N_2} = \left(\frac{\Delta f}{f}\right)_{\it{eff,He}} - \left(\frac{\Delta f}{f}\right)_{\it{eff,N_2}}$$

providing extraction of the gas density. Likewise, adding the two $$(n-1)_{He} + (n-1)_{N_2} - (n_{He} + n_{N_2})d_m = \left(\frac{\Delta f}{f}\right)_{\it{eff,He}} + \left(\frac{\Delta f}{f}\right)_{\it{eff,N_2}}$$

provides the deformation of the gas on the optical element. As with the two-color method, addition of the two effective frequencies provides deformation of optical cavity 212.

In an embodiment, with respect to FIG. 7, optical cavity 212 is replaced by optical cell 412 and the measurement becomes a phase measurement. Upon insertion of the gas into optical cell 412, the shifted light changes phase $\Delta\phi$ according to $$n_i(p, \lambda) - 1 = \frac{(\Delta\phi)\lambda}{8\pi L} - \frac{2d_M(p)}{L}$$

where L is the length of optical cell 412. When the phase change $\Delta\phi_i$ is simultaneously measured at two wavelengths i=1,2, subtraction of the two yields the index of refraction and the pressure, $$n_i(p, \lambda_1) - n_i(p, \lambda_2) = \frac{(\Delta\phi_1)\lambda_1}{8\pi L} - \frac{(\Delta\phi_2)\lambda_2}{8\pi L}$$

and addition yields the deformation through $$n_i(p, \lambda_1) + n_i(p, \lambda_2) - 2 = \frac{(\Delta\phi_1)\lambda_1}{8\pi L} - \frac{(\Delta\phi_2)\lambda_2}{8\pi L} + \frac{4d_M(p)}{L}$$

This measurement is a phase measurement, and the phase reference through which changes in the phase are measured is the stable arm of the interferometer that does not pass through the cell.

Deformometer 200 and processes disclosed herein have numerous beneficial uses, including primary pressure metrology, self-calibration of pressure transfer standards, self-calibration of deformation effects due to other external forces. Advantageously, deformometer 200 overcomes technical deficiencies of conventional articles such as a Fabry-Perot refractometer or a fixed-length optical cavity, wherein a measurement accuracy of which is limited by deformations of the optical elements by deformation of optical elements when gas is injected.

Moreover, deformometer 200 and processes herein have numerous advantageous properties. In an aspect, deformometer 200 can be used to measure refractive index and dispersion of unknown gasses. Once deformation of the optics due to gas pressure are known, which can be determined using a gas with known dispersion, deformation will remain constant for all gasses. Thus, a gas with unknown dispersion can be measured sequentially, using the same deformation parameters determined using a known gas.

Deformometer 200 and processes herein unexpectedly eliminate calibration of Fabry-Perot refractometers and fixed-length optical cavities as pressure standards, by removing a source of uncertainty in a pressure measurement. Moreover, deformometer 200 provides a potential primary standard for pressure from 0.1 mPa and 3.6 MPa.

The articles and processes herein are illustrated further by the following Examples, which are non-limiting.

EXAMPLES

Example 1. Optical Cavity for Realization of the Pascal

A fixed-length optical cavity provides a relatively simple and straightforward mechanism for determining the refractive index of a gas. If a laser is servo-locked in resonance with a Fabry-Perot cavity filled with gas, the frequency f of the laser is given approximately by:

$$f = \frac{mc_0}{2nL}, \quad (33)$$

where m (the mode order) is the integer number of wavelengths in the cavity, and L is the length of the cavity. If gas density changes, causing n to change, the servo adjusts f so as to maintain resonance with the cavity. Hence frequency changes track changes in refractive index, in a manner governed by Eq. (33). If a measurement of the initial frequency $f_i$ is made at vacuum, where n=1 exactly, and a second measurement $f_f$ is carried out at some pressure of interest, refractivity (n−1) can be determined from by Eq. (33) applied to the two frequency measurements:

$$(n-1) = \frac{f_i - f_f + \Delta m\left(\frac{c_0}{2L}\right)}{f_f}, \quad (34)$$

where $\Delta m$ is the change in mode order between the initial and final measurements. A traditional method of determining the length L of the cavity or mode order m is to measure of the free spectral range (FSR) of the cavity; FSR measurements might be used to determine m and thus $\Delta m$, with proper consideration given to the effect of dispersion in the gas. Other approaches can also be used to determine $\Delta m$, where the simplest is to rely on approximate knowledge of the pressure, as measured by an ancillary gauge of modest accuracy, to derive an estimate for $\Delta m$ that is rounded to the nearest integer.

When highest possible accuracy is required, it is also necessary to consider additional effects not captured in Eq. (33) or Eq. (34). In particular, determining the physical length L of the cavity via FSR measurements requires consideration of mirror phase shifts and, for sub-part-per-million accuracy, diffraction effects (the Gouy phase shift). Eq. (34) can be modified to correct for an additional effect of significance, namely, the length of the cavity changes in response to pressure changes. The resulting modifications to Eq. (34) due to Gouy phase, mirror phase shifts, and pressure-induced length changes are considered.

The frequency f of the laser is determined by measuring the frequency difference between the laser and a reference laser of known frequency (beat frequency measurement). Lowest noise and drift and the least sensitivity to thermal variations can be achieved if the reference laser is servo locked to a second cavity, built on the same spacer as the measurement cavity, and held at vacuum at all times.

A fixed-length optical cavity (FLOC) following the principles described above is described. The cavity is shown in FIG. 7. Four mirrors are silicate bonded to the ends of a spacer. Two of the mirrors are bonded to the ends of the slot at the top of the device. This forms a Fabry-Perot cavity that is open to its surroundings and contains the gas for which the pressure is to be measured. In practice, the entire cavity is held in a copper chamber that forms a vacuum chamber. The other two mirrors are bonded to the ends of a hole to form an enclosed reference cavity that can be continuously pumped to vacuum. A pedestal (not visible in FIG. 7) is bonded to the bottom of the spacer body with a hole for pumping the reference cavity. The spacer body, mirror substrates, and pedestal are made from Corning ULE (Ultra Low Expansion glass), silicate bonded together to form a near-monolithic structure. In equilibrium, the chamber is isothermal at the millikelvin level. The volume of the enclosure is minimized so as to minimize pV work that will disturb the thermal equilibrium when gas is admitted to the chamber.

When the FLOC is used with a gas of known refractive index, the achievable uncertainty is limited by variations in the length of the cavities with changing pressure. The changes in length of the measurement cavity are almost entirely due to the bulk modulus of the material. The reference cavity has additional changes due to bending of the windows (the mirror substrates). These effects are easily corrected through a combination of measurements and calculations, but uncertainties in the bulk modulus and in the position of the resonant modes in the reference cavity limit the attainable accuracy.

The FLOC has a broad range of operation from less than one pascal to 3 MPa. Virial coefficients for helium are known with sufficient accuracy that the refractivity as a function of pressure can be calculated up to 3 MPa with less than $1 \times 10^{-6}$ relative uncertainty which indicate that the FLOC could potentially replace part of the pressure scale that traditionally has been dominated by piston gauges. The variation of bulk modulus with pressure will cause a nonlinearity that can be considered; this has been measured for ULE. The resulting nonlinearity in pressure measurement is about 10 µPa/Pa at 3 MPa. The uncertainty of this correction is currently estimated to be less than 1 µPa/Pa.

On the low-pressure side, the FLOC has an operating range extending down to the regime of ionization gauges. When compared to an ionization gauge, the FLOC noise level was only 0.1 mPa for 1 s averages. In principle, sub micropascal measurements can occur. Lasers locked to Fabry-Perot cavities near room temperature have achieved fractional frequency stabilities below $10^{-16}$ for averaging times on the order of 1 s, where the basic limitation is thermal noise (in the mirror substrate, the coatings, and the cavity spacer). For typical gas species such as nitrogen, oxygen, and water vapor, this thermal noise floor corresponds to about $4 \times 10^{-7}$ Pa. However, the stability degrades rapidly as the measurement time increases, and as a practical matter the measurement floor will be limited by thermal or temporal instabilities of the cavity and by outgassing.

The FLOC is a device that can be subject to pressure-induced changes in the mechanical length of the cavities, which can be measured and corrected or calculated from known values of material elastic constants. For pressures above 100 Pa, best performance can be achieved if the pressure distortions are evaluated by comparison of FLOC pressure measurements to the VLOC.

FLOC can be an independent standard using two gasses for which the relationship of refractivity to pressure is well known, either from theory (for helium) or from experimental measurements (potentially measured to high accuracy with the VLOC). This can be done without requiring direct comparison to a known pressure standard, working under the assumption that the only significant error in the FLOC is pressure distortion. If, for example, measurements of refractivity are made for helium and nitrogen with both at the same pressure (where the pressure need not be known), then the two measured refractivities can be used to determine two unknowns; (a) the unknown pressure and (b) the pressure distortion of the FLOC. In effect, the known refractivities of the two gasses serve as a mechanism for traceable dissemination of the Pascal where traceability is provided by the atomic/molecular properties of the gasses in place of a direct comparison to a primary standard. (Except in the case of helium, there is indirect comparison to the pressure standard that was used when the gas refractive index was determined experimentally.) The uncertainty of pressure measurement using the two-gas dissemination method is potentially a few parts in $10^6$ at atmospheric pressure, if the refractivity of nitrogen can be measured with comparable uncertainty.

FLOC can be tested with three known gasses to uncover contamination of one of the gasses used for pressure dissemination. Three-gas tests combined with other internal consistency checks can be used to verify continued proper operation of all components of the system other than the temperature sensor. With this distortion correction, the FLOC should be able to extend the high accuracy of the VLOC to a much broader pressure range, conceivably spanning 9 orders of magnitude from millipascal to megapascal.

Example 2. Quantum-Based Vacuum Metrology

In this example, equations are numbered starting at Eq. 1.

Traditionally pressure is defined as a force per unit area, but as pressures extend further and further below an atmosphere (deeper into the vacuum) this definition becomes increasingly inconvenient and impractical. Instead, at low pressures the pascal is realized through the ideal gas law, $$p = \rho_N k_B T = \rho_V RT \tag{1}$$

where $\rho_N$ is the number density of particles and $\rho_V$ is the molar density, R is the gas constant, and T is the temperature. In this formulation, pressure metrology becomes a counting problem, specifically, counting particles in the vacuum by any available technique. This reflects the applications as well: in the high-vacuum and below, most users are concerned with the amount of gas in the vacuum, e.g. as a contaminant, rather than the force it produces. Eq. (1) fundamentally relates pressure to the Boltzmann constant $k_B$. SI units are tied to defined physical constants, e.g. Plank's constant or the speed of light in vacuum. Furthermore, there is an accompanying shift away from electronic to photonic measurements. Measuring photons instead of electrons has several inherent benefits: optical signals are generally less to prone to pick-up noise from stray signals than are electrical signals, especially for long transmission distances. Photonic signals are high-fidelity, and can travel farther without regeneration. Additionally, optical fiber is lighter and has a larger bandwidth per cross-sectional area than copper wire, and can better handle harsh conditions, and so it has practical advantage, especially for use in aircraft or launch vehicles. Photonic measurements can be readily multiplexed and allow remote interrogation. Furthermore, photons can be used to directly probe the electronic states of atoms or molecules, and to prepare quantum states, making them the tool of choice for fundamental quantum measurements.

At pressures from about at atmosphere to the high vacuum, classical metrology technologies are mature and can deliver uncertainties at the level of a few parts in $10^6$, generally adequate for stakeholders. An advantage of pressure standard based on the FLOC technique is that it has the perspective to replace traditional mercury manometers, which are often used in the vacuum range of $10^{-3}$ Pa to $10^5$ Pa, thus removing toxic mercury from the calibration lab. The primary high-accuracy manometers used in this pressure range also tend to be rather large, expensive, and require a high level of expertise to operate, and are thus usually owned and operated by national metrology institutes or sophisticated calibration laboratories. The FLOC and the other quantum-SI techniques can be a portable primary standard.

For measurements at atmospheric pressures and into the low vacuum, manometry is the traditional technique. Manometers operate on the principle that a fluid in a column sealed at the top will create a vacuum in the sealed end of the column when it experiences the downward force due to its own weight. The pressure on the other end of the column (the pressure of interest, often atmosphere) exerts a force that must balance the gravitational force, for the fluid to be in equilibrium. The pressure in pascal is then $P=\rho_f g h$ where $\rho_f$ is the fluid density, g is the local acceleration due to gravity, and h is the column height. The determination of column height is done using an ultrasonic technique, and care is taken to minimize uncertainty from other sources including temperature. These instruments can claim relative standard uncertainties as low as $3\times10^{-6}$ as demonstrated in an international key comparison.

Several laser-based interferometer techniques are under study to interrogate the refractivity n−1 of a gas (n is index of refraction) which is a proxy for the gas density $\rho_N$, and ultimately the pressure p through the equation of state:

$$p=k_B T \rho_N (1+B_\rho \rho_N + C_\rho \rho_N + \ldots)  \quad (5)$$

where $k_B$ is the Boltzmann constant, T is thermodynamic temperature, and the deviations from the ideal gas law arising from two- and three-body interactions are considered by density virial coefficients $B_\rho$ and $C_\rho$. For helium gas, the virial coefficients in (5) are calculable through statistical mechanics at a level that contributes less than one part in $2\times10^7$ to the uncertainty of pressures below 1 MPa.[50] Current state-of-the-art thermodynamic thermometry implies that the thermal energy $k_B T$ can be measured better than one part in $10^6$. Therefore, with the highest accuracy measurements of helium refractivity, uncertainties from theory and thermodynamic temperature imply that the pascal can be realized with uncertainty at the one part in $10^6$ level, which would place it competitive with state-of-the-art piston gauges at 1 MPa, and better than state-of-the-art mercury manometers at 100 kPa and below.

Depending on the details of these approaches, the techniques described herein result in a device that is considered alternately functionally-primary, primary, or a transfer standard. In all cases, two major obstacles must be overcome which are discussed below: The pressure-dependent index of refraction must be known to high accuracy, and any distortions in the measurement device must be accounted for. We begin with a brief discussion of the underlying physics before turning to a description of several experimental devices. The speed of light with frequency ν in a gas, c, is reduced from that in an ideal vacuum $c_0$ by a coefficient n, that is, $$c=c_0/n. \quad (6)$$

The mechanism by which this happens concerns the polarizability of the particles constituting the gas. Such polarizabilities are the quantum basis of the method, and our ability to calculate the polarizability of helium and thus its refractivity is ultimately what makes the technique described herein a fundamental standard, consistent with the quantum-SI. Theoretic determinations of these fundamental atomic properties were performed at relativistic and quantum electrodynamics (QED) levels. Extending the method to gases other than helium is done in a ratiometric way that preserves the fundamental nature of the method.

The relation of n to $\rho_N$ for an isotropic homogeneous medium is obtained by the Lorentz-Lorenz equation, $$\frac{n^2-1}{n^2+2} = \frac{1}{3\varepsilon_0}\rho_N \alpha = A_R \rho_V, \quad (7)$$

where α is the dynamic polarizability of an individual molecule of gas in the volume, $A_R$ is a virial coefficient, the molar dynamic polarizability, and $\varepsilon_0$ is a fixed physical constant, the vacuum dielectric permittivity. By determining index refraction, we can realize $\rho_V$. To calculate polarizability from first principles requires considering relativistic, QED, and finite mass effects, and this has been done for both the polarizability and refractive index of helium to an uncertainty of below one part in $10^6$. (note that for accuracy on the order of one part in $10^6$, it is also necessary to include the effect of magnetic susceptibility, which is omitted in Eq. (7) for simplicity.

Pressure sensors based on refractometry can in principle be based on any gas and He has the advantage that it's pressure dependent index of refraction has been calculated to high accuracy, making such a device intrinsically absolute. However, in a practical device made of ultra-low expansion (ULE) glass, helium has the disadvantage that it is absorbed into the glass. And so, a refractometer using gases other than helium, such as $N_2$, may be a more useful method of pascal dissemination, but first the index of refraction of that measurement gas must be determined.

Refractometers are pressure standards. The concept of index of refraction is that a photon with a fixed wavelength will have a different frequency in the presence of gas than in a vacuum. A laser can propagate in each of two channels, one filled with gas and the other evacuated, and measures the frequency change, as performed in FLOC. More precisely, a laser is wavelength-locked in resonance to a Fabry-Perot cavity, if gas density (i.e., pressure) changes, the servo adjusts the frequency f to maintain resonance with the cavity. Changes in f then give the index of refraction according to:

$$n - 1 \approx \frac{-\Delta f + \Delta m(c_0/2L)}{f}, \quad (8)$$

where $\Delta f = f - f_0$ ($f_0$ is the laser frequency in vacuum, and f is the frequency in the gas medium,) $\Delta m$ is the change in mode order, and L is the length of the cavity. In practice, the laser frequency in eqn. (8) is never measured directly but is determined by measuring the difference in frequency between the measurement laser and a reference laser locked to the vacuum channel. Both the reference and vacuum channel deform under pressure. Much of the deformation is an overall compression due to finite bulk modulus, which is common to both the reference and measurement channels so that the effect largely cancels out. Another important effect is bending of the mirror surfaces in the reference channel due to the pressure differential across these mirrors. The measurement equation for pressure determined by the FLOC is then:

$$p = \frac{1}{\left(\frac{3}{2k_BT}\right)A_R - d_m - d_r}\left(\frac{f_{vac} - f_{gas}}{f_{gas}}\right), \quad (9)$$

where $f_{vac}$ ($f_{gas}$) is the frequency in the evacuated (gas-filled) cavity. The distortion term $d_r$ is essentially the fractional change in length of the reference cavity when gas is added to the cavity (a negative number). Similarly, $d_m$ is the negative of the fractional change in the measurement cavity length (a positive number, where the sign is an artifact of the derivation). For simplicity, Eq. (9) only retained terms of order $\Delta f/f$. The correction for the distortion terms are approximately $d_m \approx -d_r \approx 1.1 \times 10^{-11}$ Pa$^{-1}$, whereas the index n varies with p by $3.2 \times 10^{-10}$ Pa$^{-1}$ for helium at 303 K. Note that the two correction factors cancel each other within 10%. Therefore, without any correction for the distortion, the FLOC is a primary standard for pressure to about 0.3%.

Figure 9:
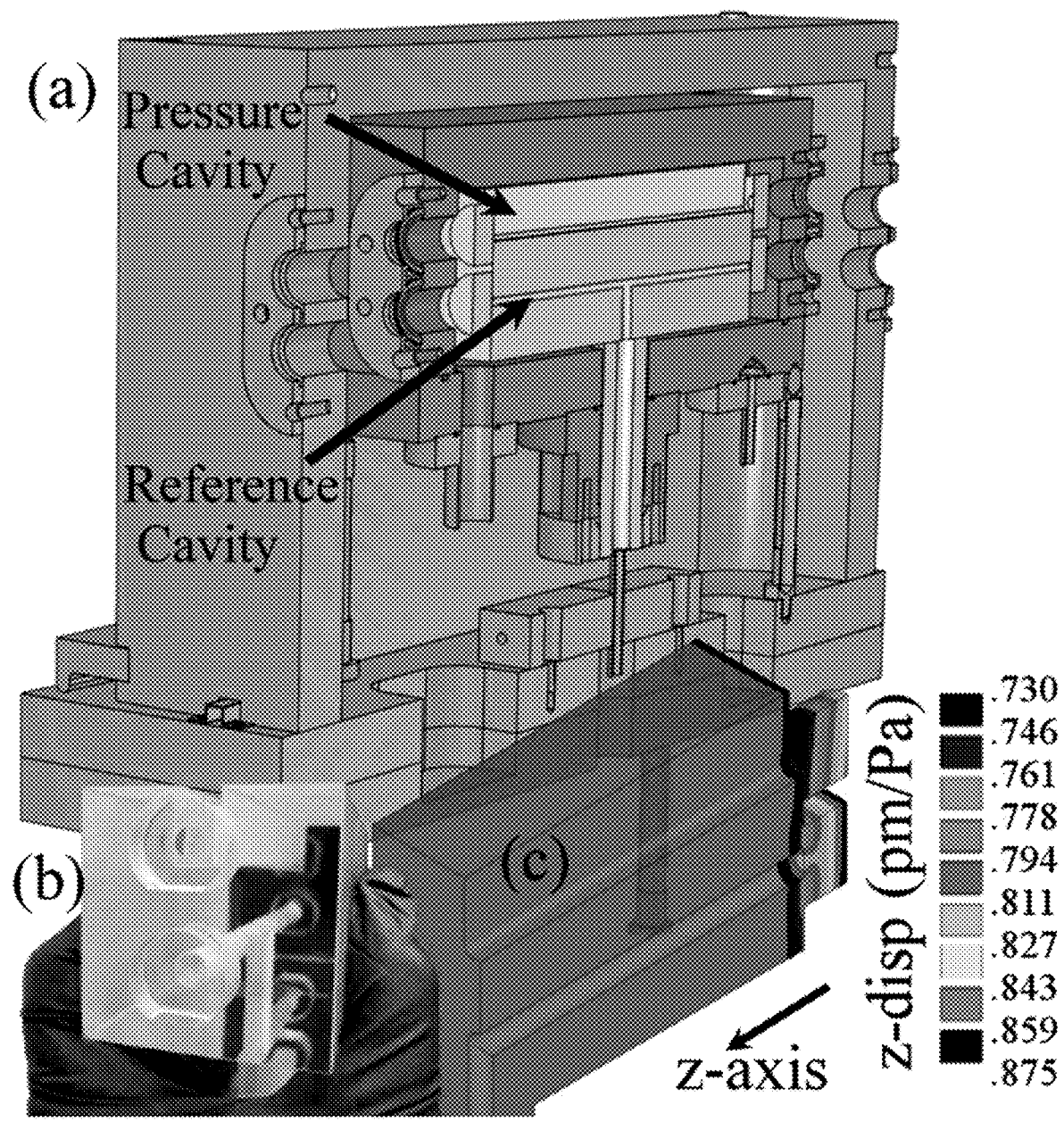
FIG. 9 shows a refractometer in panel A and panel B and a deformation in panel C for cavity lengths per pascal of pressure on the measurement cavity when the reference cavity is at vacuum.

FIG. 9 shows (a) dual FP cavity refractometer in its thermal/vacuum apparatus: the pressure measurement cavity is in gas, and the reference cavity is ion-pumped to high-vacuum, and panel (b) is a photograph of the refractometer. Panel (c) shows distortions in cavity lengths per pascal of pressure on the measurement cavity when the reference cavity is at vacuum.

Figure 10:
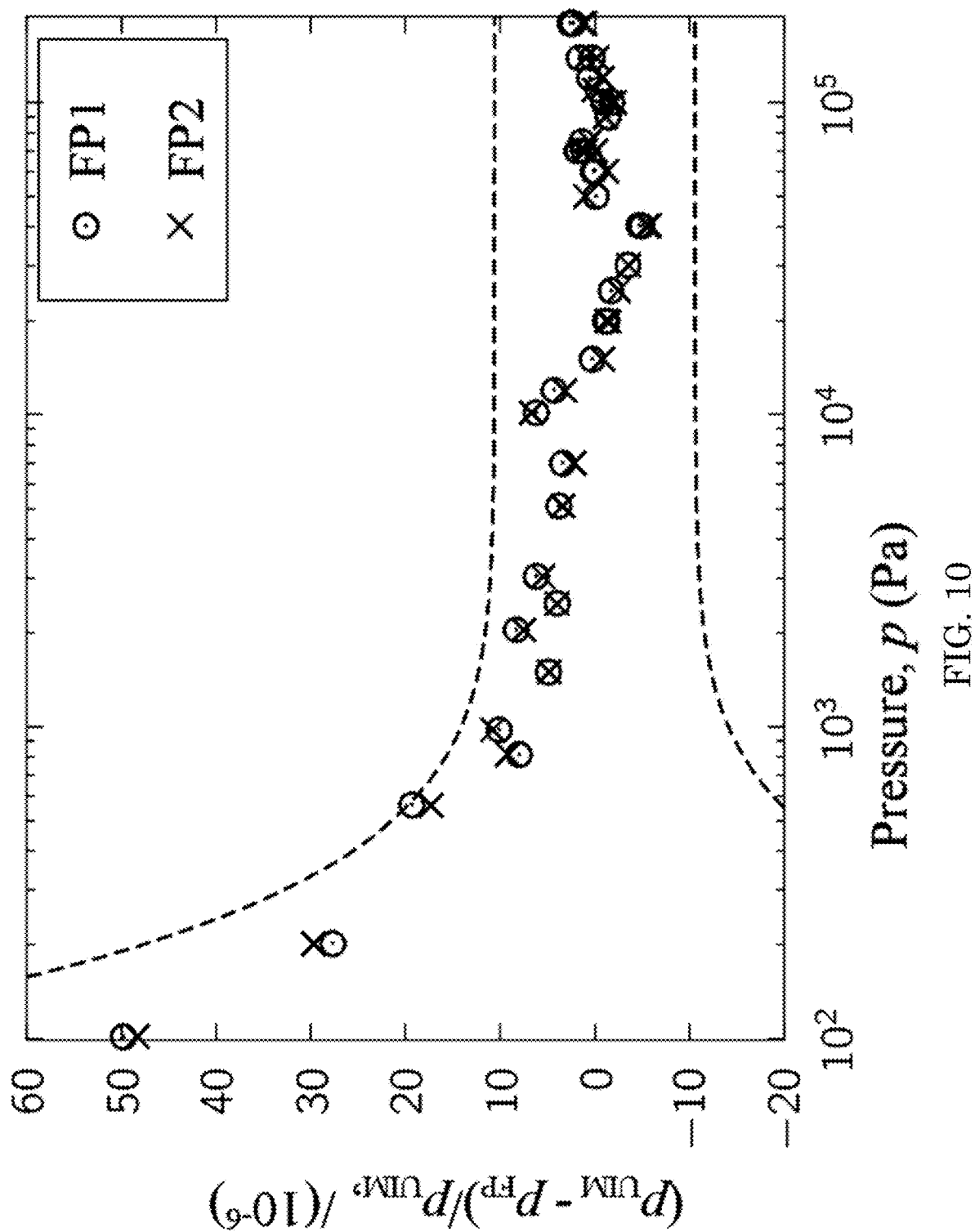
FIG. 10 shows a graph of a disagreement in pressure as measured by two separate laser refractometers (pFP) and mercury ultrasonic manometer (pUIM)

Performance can be achieved by measuring two or more different gases of known refractivity at a certain pressure. Both the cavity distortion and the absolute pressure can be determined, since measurements of two gasses provide two equations in the two unknowns. Helium refractivity is known as a function of pressure by calculation. When a measurement is made using two gasses, the FLOC provides traceability to primary methods and becomes functionally primary in the important sense that it never needs to be calibrated against a pressure standard. Thus, the invariant atomic/molecular properties of the gasses (i.e., refractivity) will serve as a practical functional standard for universal dissemination of the Pascal. In past work, the FLOC demonstrated ((2 mPa)$^2$+(8.8×10$^{-6}$ p)$^2$)$^{1/2}$ expanded uncertainty as a transfer of the pascal, and so the FLOC as a transfer standard of the pascal outperforms the manometer at pressure below about 1 kPa. FIG. 10 shows a disagreement in pressure as measured by two separate laser refractometers (pFP) and mercury ultrasonic manometer (pUIM). The dashed lines are the manometer uncertainty.

FLOC is a primary pressure standard when used with helium gas, but distortion of the optical cavity and mirrors, including dynamic effects caused by diffusion of helium into the ULE glass include uncertainty. Even if the measurement gas is nitrogen or some other species that does not diffuse into the glass, distortion is accounted for. A refractometer can be a primary standard with performance of characterization of the distortion.

Figure 11:
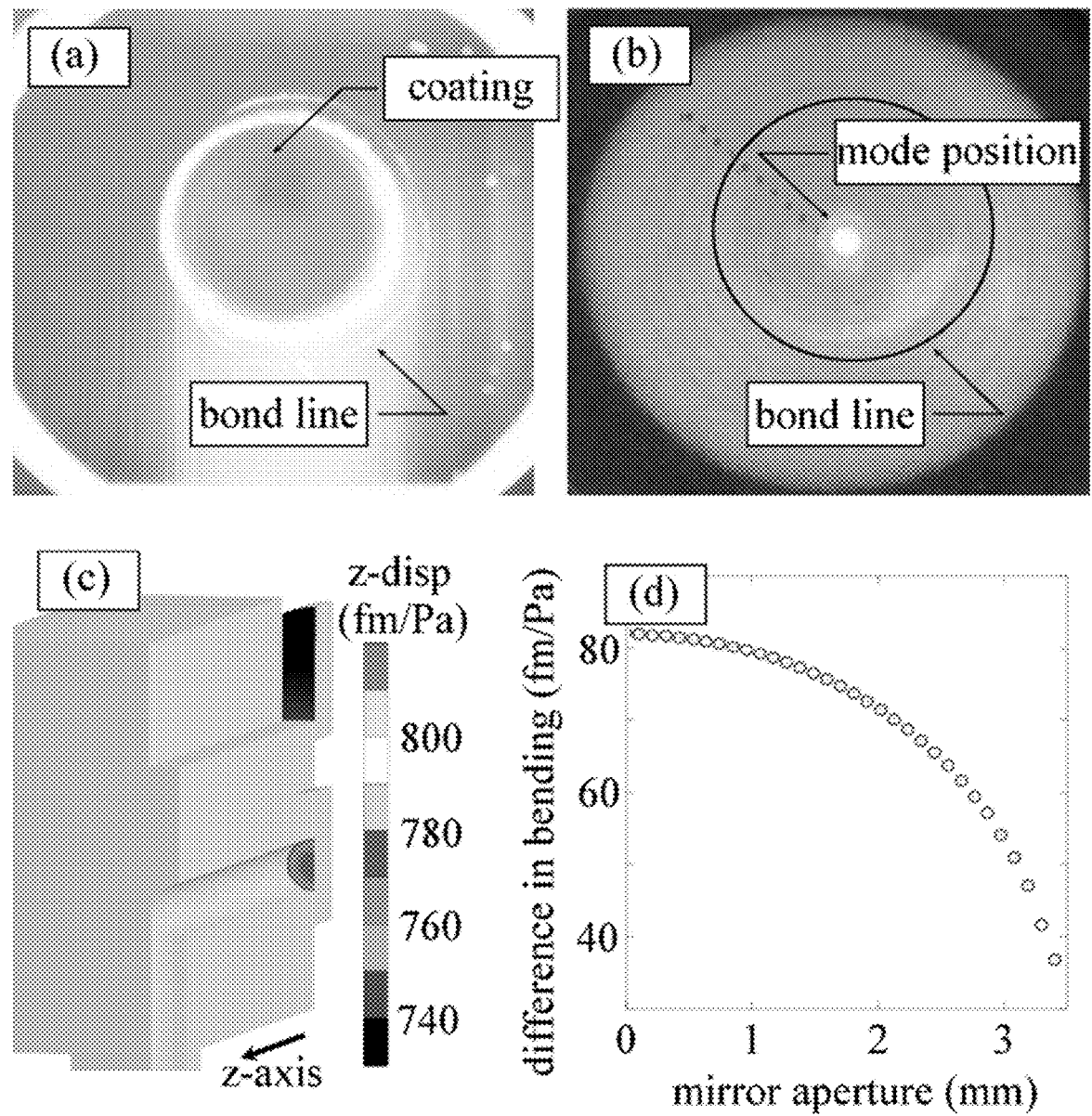
FIG. 11 shows a correction to an optical cavity for distortion via finite-element analysis and an inspection of the mode position on the mirror. Panel (a) is an image of the mirror showing the bond interface. Through edge-detection, an estimate can be made of the area upon which the pressure acts. In (b), another image is taken with a laser beam aligned to the cavity resonance. By combining these two images, an estimate of the location of the beam on the mirror surface is made. The result of a finite-element analysis is shown in (c) datasheet values were used for elastic properties of ULE glass, and the geometry was estimated by the bond line in panel (a). The difference in mirror bending calculated by finite-element is extracted as a profile, shown in panel (d)

With reference to FIG. 11, an optical technique finds the laser beam location on the mirror surface, and shape is calculated through a finite-element analysis. From this, a bending profile is extracted. By combining the bending profile with knowledge of the beam location, an estimate can be made of the distortion error in the FLOC. Here, correcting FLOC distortion is performed by finite-element analysis and an inspection of the mode position on the mirror. Panel (a) shows an image of the mirror with a bond interface. Through edge-detection, an estimate can be made of the area upon which the pressure acts. In panel (b), another image is shown with a laser beam aligned to the cavity resonance. By combining these two images, an estimate of the location of the beam on the mirror surface is made. The result of a finite-element analysis is shown in panel (c), wherein datasheet values were used for elastic properties of ULE glass, and the geometry was estimated by the bond line in panel (a). The difference in mirror bending calculated by finite-element is extracted as a profile, as shown in panel (d).

It is contemplated that elastic properties of the glass can be determined directly by mechanical means, using resonant ultrasound spectroscopy. Achieving relative uncertainty lower than one part in 10$^5$ in helium refractivity would require determination of the bulk modulus within 0.03%. Additionally, doping inhomogeneities in ULE (i.e., giving rise to variations in the coefficient of thermal expansion) involves a token whose elastic properties are measured by mechanical means that can include a reflection of the elastic properties of the FP cavity itself.

Multi-wavelength interferometry and calculated dispersion of helium can determine FLOC deformation. This can be accomplished by interrogating the FLOC with two laser frequencies $v_1$ and $v_2$ locked to the optical cavity, which has the advantage that it can be done in-situ. The measurement equation for pressure determined by the FLOC under these conditions to first order is:

$$p = \frac{1}{\delta\alpha}\frac{k_BT}{2\pi}\left[\left(\frac{\delta v_1}{v_1}\right) - \left(\frac{\delta v_2}{v_2}\right)\right]. \quad (10)$$

Here $\delta\alpha$ is the change in the atomic polarizability between the two laser frequencies at the same gas pressure p. Again, the atomic polarizability $\alpha(\lambda)$, where $\lambda = c/v$, is known for He from fundamental theoretical calculations. In Eq. (10), deformation terms that were present in Eq. (9) have cancelled and thus, using two lasers, we now have a primary FLOC. The two-laser method involves dispersion that is a small effect compared to refractivity. For two practical laser frequencies, say 633 nm (HeNe laser) and 1550 nm (standard telecom wavelength), the difference in n−1 is approximately 1.6×10$^{-7}$ (at atmospheric pressure), which is more than 200 times smaller than the value of n−1. Some sources of noise and systematic uncertainties will increase, and the current state of theory and calculation of helium dispersion would limit the approach to 5 parts in $10^6$. A primary FLOC can include this multi-color technique.

Figure 12:
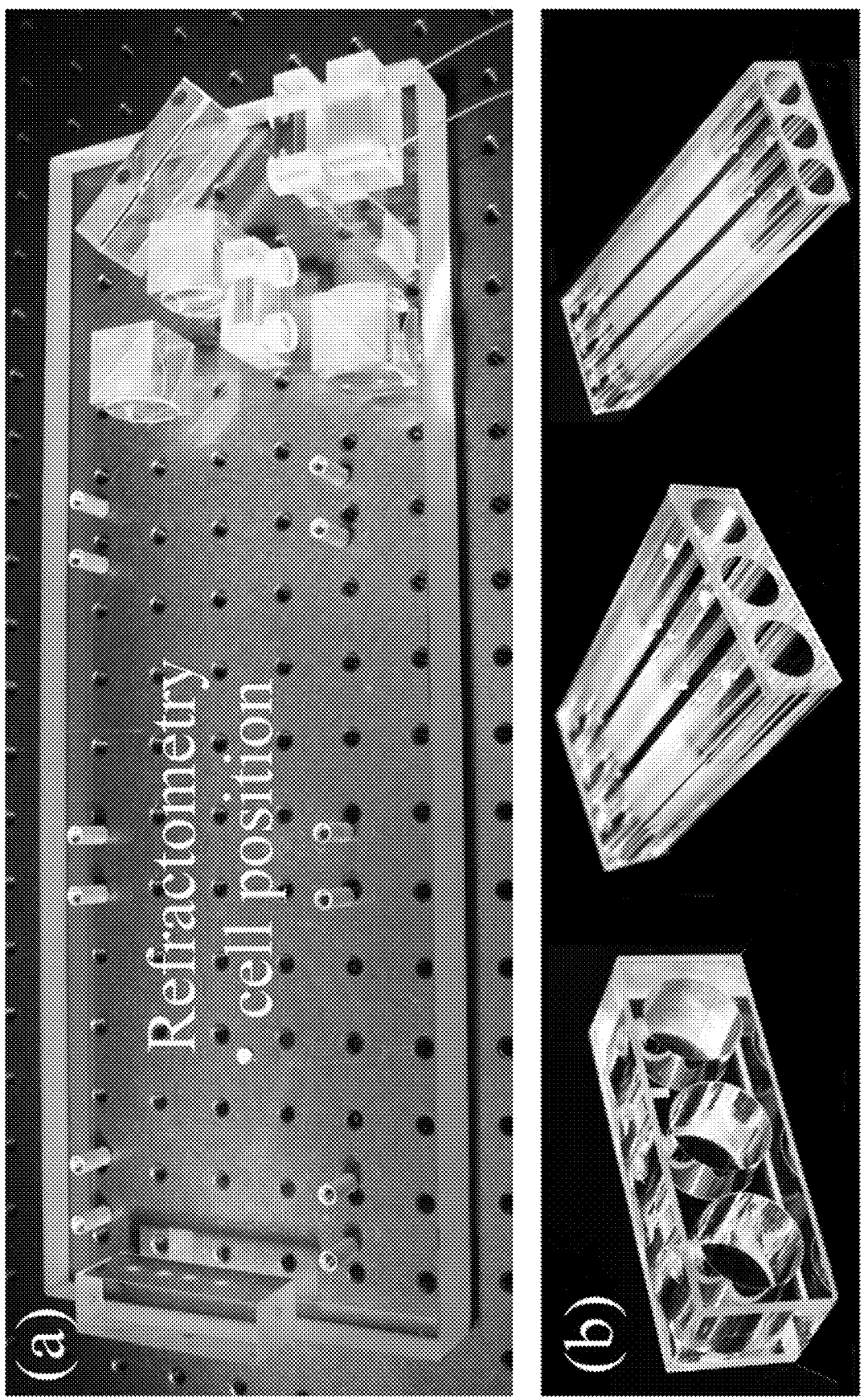
FIG. 12 shows (a) MIRE apparatus and (b) refractometry cells of three different lengths but which are otherwise nominally identical. Each borehole has a gas inlet and outlet.

Deformations of FLOC can be avoided or corrected in refractometers of alternate design. One such design is the Monolithic Interferometer for REfractometry (MIRE). A feature of the apparatus is three interchangeable triple-cells of different length as shown in FIG. 12(a), but almost identical geometries, material properties, and location of the laser beams through all windows. This feature is designed to make the window distortion common-mode in measurements of helium refractivity performed in cells of different lengths, and allowed cancellation of error to 1.8%, which resulted in a 9.8 ppm relative uncertainty in the refractometer. When the uncertainty in the refractometer was combined with the uncertainties in the thermodynamic temperature of helium, gas purity, and the Boltzmann constant, the total standard uncertainty in this primary realization of the pascal was 11.7 ppm. With reference to FIG. 12, panel (a) shows MIRE apparatus, and panel (b) shows refractometry cells of three different lengths but which are otherwise nominally identical. Each borehole has a gas inlet and outlet.

Example 3. Refractometry Using a Helium Standard

In this example, equations are numbered starting at Eq. 1.

Measuring air refractive index can provide realization of the meter via interferometry. Laser wavelengths in vacuum can be measured to high accuracy, but the wavelength in air, which serves as the basic metric for almost all interferometry, requires knowledge of refractive index. Most commonly, refractive index is determined by measuring air pressure, temperature, humidity, and possibly carbon dioxide concentration, and calculating the refractive index using Edlen or similar equations. With some care we can routinely determine refractive index in a uniform laboratory environment to 1 part in $10^7$, and with state-of-the-art environmental sensors the expanded (k=2) uncertainty might be reduced as low as 2 parts in $10^8$. If yet smaller uncertainty is needed, several alternate approaches could be pursued. For example, it may be possible to carry out the measurements in vacuum, or to perform measurements in a helium environment. Helium has two advantages relative to air: (1) the refractive index is known to very high accuracy from ab initio calculations[2] and (2) the molar refractivity of helium is about one eight that of air, so that for a given uncertainty of pressure and temperature measurement, the refractive index of a helium sample can be determined with one eighth the uncertainty of air refractive index.

When measurement in vacuum or a helium atmosphere is not practical, a final possible route to high-accuracy displacement measurements is to employ a gas refractometer to determine the air refractive index. A refractometer based on a laser locked to the transmission maximum of a Fabry-Perot interferometer (hereafter designated FPI) of nominally fixed length is described. Changes in laser frequency track changes in refractive index as the interior of the FPI cavity is filled with gas or pumped out to vacuum. For an ideal cavity, the change in laser frequency is proportional to the change in refractivity going from the evacuated to the filled state. (Refractivity is n−1, where n is the refractive index.) Since the evacuated state has a known refractive index n=1, measuring the change in refractive index also tells us the absolute refractive index of the gas. A practical problem in implementing this scheme is the difficulty in accounting for distortions of cavity dimensions caused by the changing pressure. The method herein overcomes the problem by using helium gas at atmospheric pressure as a known reference, because the refractive index of helium can be accurately calculated from first principles. Since the refractive index of helium is known, we can predict the change in laser frequency when the cavity is filled from vacuum to some helium pressure. Any deviation from this prediction provides a measure of cavity distortion, allowing us to "error map" the refractometer as a function of pressure. Accurately measure helium pressure and temperature is involved to carry out this error correction procedure, but the low refractive index of helium puts minimal demands on the required accuracy of the sensors. Also, the high-accuracy sensors do not need to be a permanent part of the apparatus, since the error is not expected to change with time.

The refractivity of helium, n−1, is very nearly proportional to the molar density $\rho$ of the gas sample and to the molar polarizability of helium $A_R$, that is, $n-1 \propto \rho A_R$. The proportionality is not exact in dense gasses. Departures from linearity are considered in the Lorentz-Lorenz equation:

$$\frac{(n^2-1)}{(n^2+2)} = A_R\rho + B_R\rho^2 + \ldots \quad (1)$$

where BR, the second refractivity virial coefficient, accounts for two-body interactions. Equation (1) allows calculation the refractive index if the molar density is known. The molar density as a function of pressure and temperature can be determined from the expressions $$\rho = P/(ZN_A kT) \quad (2)$$

$$Z = 1 + B(T)\rho + C(T)\rho^2 + \ldots \quad (3)$$

where P is pressure, T is absolute temperature, k is the Boltzmann constant, $N_A$ is the Avogadro constant, Z is the compressibility factor for a non-ideal gas, and B(T) and C(T) are virial coefficients for the compressibility expansion. All of the parameters to make this calculation are known. In particular, $A_R$ is known from ab initio calculations of the atomic polarizability. It is possible to combine calculations of the static polarizability with dynamic polarizability to determine a value whose uncertainty is limited by lack of QED corrections to the dynamic terms. As a function of wavelength $\lambda$, the molar polarizability is then given by $$A_R = 0.51725407 + \frac{1197.5410}{\lambda^2} + \frac{3.290677 \times 10^6}{\lambda^4} + \frac{9.800874 \times 10^9}{\lambda^6} \quad (4)$$

where $A_R$ is expressed in units of $cm^3/mol$. The estimated relative uncertainty of this expression is $1 \times 10^{-6}$ at optical frequencies. At $\lambda$=633 nm, equation (4) yields $A_R$=0.5202634(5) $cm^3/mol$.

$B_R$ has an effect on calculation and is known. We estimate $$B_R = -0.032 - 0.0001T \quad (5)$$

where $B_R$ is expressed in units of $cm^6/mol^2$, the temperature T is between 273 K and 323 K, and the wavelength is in the vicinity of 633 nm. The virial coefficient B(T) is known. Over the range 275K to 325K, the result is $$B(T) = 13.028 - 0.0041T \quad (6)$$

where B(T) is expressed in cm³/mol. C(T) is sufficiently small that it has no noticeable effect on the calculations.

This provides everything to calculate the refractive index. The calculated refractive index for 633.0 nm radiation, at 101 325 Pa pressure and 20° C., is 1.000 032 426 00(8), where the standard uncertainty ($8 \times 10^{-11}$) arises primarily from uncertainty in the Boltzmann constant.

At 632.991 nm wavelength (the approximate vacuum wavelength of a helium neon laser), for pressures less than 110 kPa and temperatures between 273 K and 323 K, we find empirically that a good approximation to the calculation described above is $$n = 1 + \{9.38598 \times 10^{-8}(P/T) - 1.333 \times 10^{-13}(P/T)^2\} \times \{0.999957 + 1.5 \times 10^{-7}T\} \tag{7}$$

where P is in Pascal and T is in Kelvin. The error in this approximation relative to the more exact procedure is nearly negligible (less than $4 \times 10^{-11}$) over the stated range.

Figure 13:
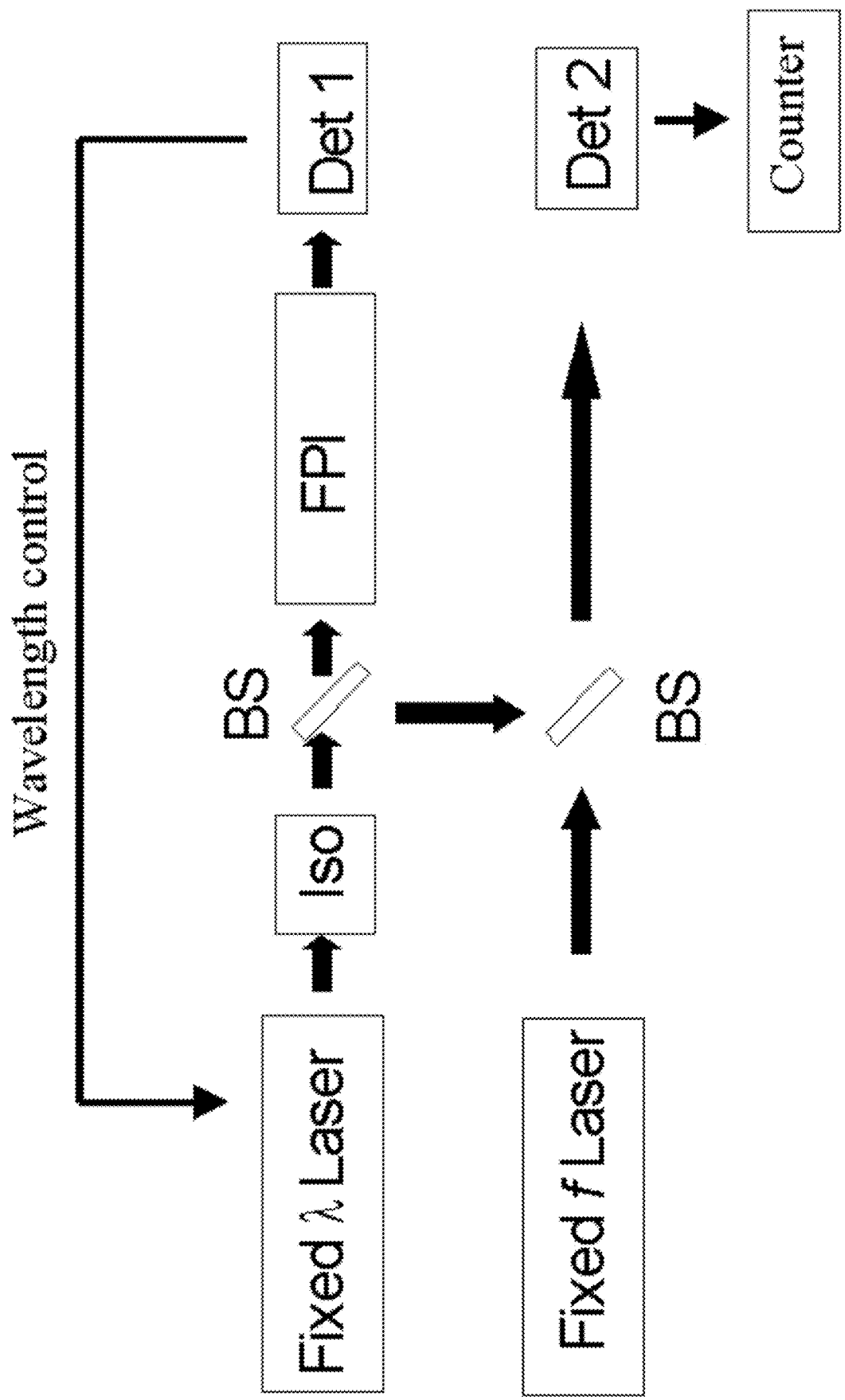
FIG. 13 shows an refractometry apparatus with a feedback loop from detector (Det 1) to keep a fixed wavelength laser locked to a transmission maximum of the FPI. Beam splitters (BS) combine beams from two lasers on Det 2, and the frequency difference is measured by the counter. "Iso" is a Faraday isolator.
Figure 14:
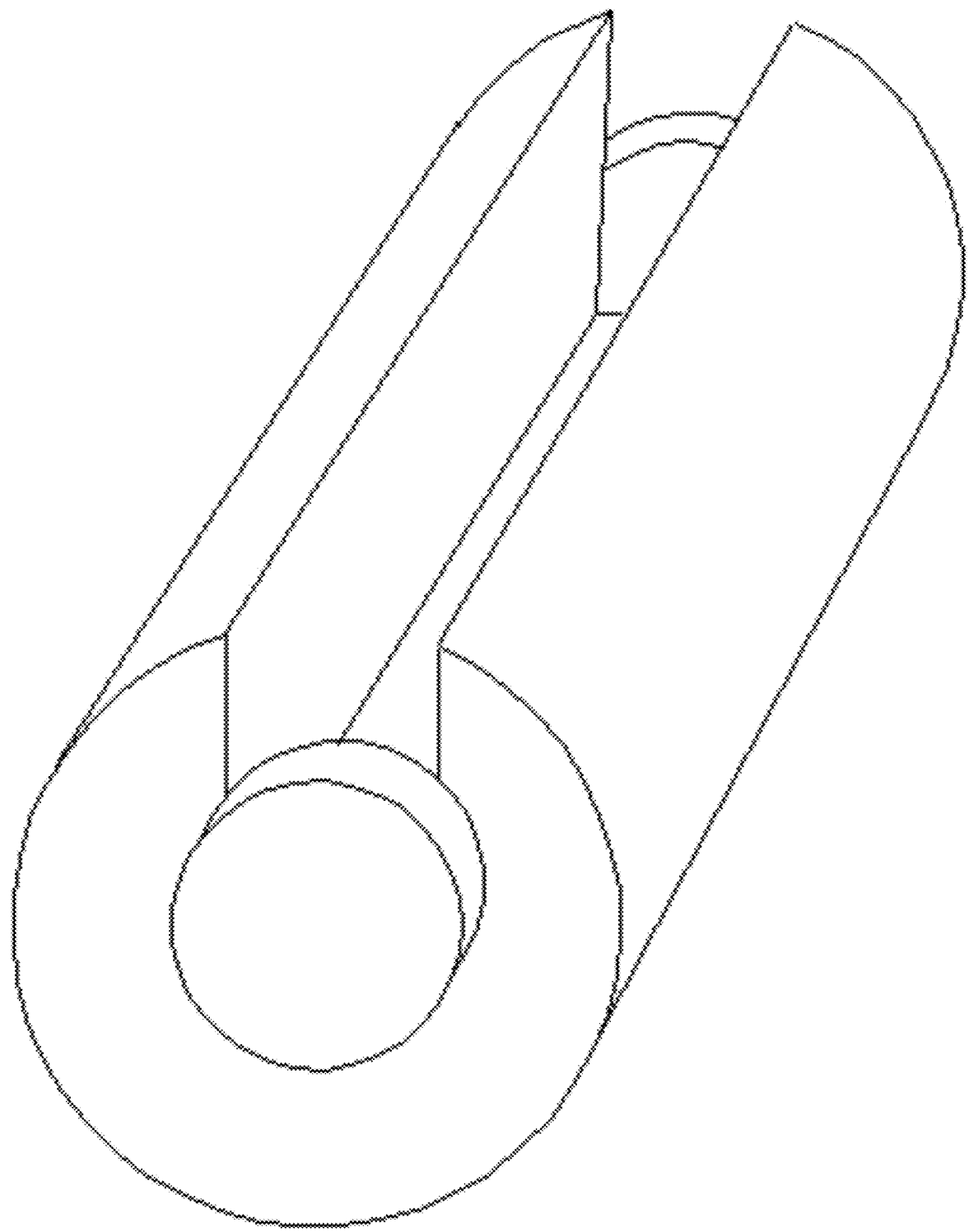
FIG. 14 shows a cavity.

The Fabry-Perot refractometer is shown in FIG. 13. A laser shines through a high-finesse Fabry-Perot cavity. The cavity, as shown in FIG. 14, is made from a ZERODUR rod that has a channel sawed through the center and mirrors optically contacted to the ends. The open side of the cavity assures that the gas inside the cavity is in good equilibrium with gas in the surrounding area. Thus, if it were placed right next to the measurement path in an interferometer, we could expect that the refractive index inside the refractometer would closely match the refractive index in the measurement path. The mirror radii are large relative to the length of the cavity but sufficiently small so that they require only minimal parallelism of the polished ends of the rod. The cavity is consequently easy to construct.

A laser is locked to a transmission maximum of the cavity using a simple dither of laser frequency, phase sensitive detection of the transmission maximum with a lock-in amplifier, and an integrating feedback loop to control laser frequency and wavelength. In this manner the laser remains locked to the center of the transmission maximum, maintaining constant wavelength even as the refractive index within the cavity changes (under the assumption that the cavity length remains constant). To maintain constant wavelength with changing refractive index, the servo system must readjust the laser frequency, and the change in laser frequency is proportional to the change in refractivity (n−1).

To determine the frequency of the wavelength-stabilized laser, the output is mixed with the output of a second, fixed-frequency laser; the resulting beat frequency, measured with a frequency counter, is the difference between the unknown frequency of the wavelength-stabilized laser and the known fixed frequency of the second laser. An iodine stabilized laser is the fixed-frequency source.

Two independent refractometers are housed in a common environmental chamber that can be pumped to vacuum. A gas laser with PZT length control is locked to a 453-mm long FPI cavity and a tunable diode laser is locked to a 94 mm cavity, about ⅕ the length of the long cavity.

The basic resonance condition for a Fabry-Perot cavity is that the round-trip phase shift be an integral multiple of $2\pi$. This phase shift consists of several parts. In first approximation the shift is $2\pi(2L/\lambda)$ where 2L is the round-trip length through the cavity. To this must be added phase shifts $\varphi_{m1}$ and $\varphi_{m2}$ for reflection at the two end mirrors and a phase shift $\varphi_G$ that occurs because the light within the cavity is not a plane wave. This is the Guoy phase shift with an appropriate sign convention. The resonance condition is $$2\pi m = (4\pi L/\lambda) + \varphi_{m1} + \varphi_{m2} + \varphi_G \tag{8}$$

where m is some integer. The three phase shifts $\varphi_{m1}$, $\varphi_{m2}$, and $\varphi_G$ represent only a very small part of the total phase shift and are nearly constant. If they are ignored, and if we make the substitution $\lambda = c/(nf)$ where f is the laser frequency, c is the speed of light in vacuum, and n is refractive index, then the resonance condition takes on the familiar form $$f = mc/(2nl) \tag{9}$$

When a gas is admitted to the cavity and the frequency of the locked laser changes from some initial value $f_i$ to the final value $f_f$, equation (9) implies that the final refractive index is given by $$n - 1 = \frac{f_i - f_f + \Delta m(c/2L)}{f_f} \tag{10}$$

Here $\Delta m$ is the change in order number, which can be determined by using two cavities in a Vernier-type arrangement. Alternately, $\Delta m$ might be determined by measuring pressure and temperature in the cavity and determining n with modest accuracy, sufficient to resolve any ambiguity in $\Delta m$, and then using equation (10) to improve the accuracy of n.

F is the numerator in equation (10), $$F = f_i - f_f + \Delta m(c/2L) \tag{11}$$

F can be thought of as the total change in frequency of the laser, where the term $\Delta m(c/2L)$ includes the effect of mode hops. Note that f differs from $f_f$ by no more than the free spectral range (fsr) of the cavity, because beyond this point the laser will mode hop, locking to the next order m. Therefore, the term $f_i - f_f$ contributes much less to F than does the term $\Delta m(c/2L)$, where $\Delta m$ may be as large as 400. It is usually assumed that fsr=c/2L, and thus measurement of the free spectral range provides the needed information to evaluate F. However, the dependence of the mirror phase shifts $\varphi_{m1}$ and $\varphi_{m2}$ on frequency complicates matters. The dependence of phase shift on frequency has very little bearing on equation (10), but the shift in $\varphi_m$ has a significant influence on the measurement of free spectral range. The fsr is the difference in frequency of two lasers locked to adjacent longitudinal modes of the cavity. The difference in phase shift between the two modes causes a small error in determination of c/2L which is multiplied by a fairly large number ($\Delta m$) in equation (10). The resulting error in refractive index is small (less than $10^{-9}$ for our 453 mm long cavity) but not negligible in some applications.

Equation (10) includes a length of the cavity that is constant, whereas the length changes in response to pressure.

If the cavity changes length from $I_i$ to $I_f$, then the equation must be modified to read $$n - 1 = \frac{f_i - f_f + \Delta m(fsr)}{f_f} + n\left(\frac{l_i - l_f}{l_i}\right) \tag{12}$$

The expected change in length is on the order of $\Delta l/l = 6 \times 10^{-7}$, large enough that it is necessary to carefully account for the effect. The compression is a function of the bulk modulus B of the material and of the change in pressure $\Delta P$:

$$\Delta l/l = (\frac{1}{3})B\Delta P \tag{13}$$

The bulk modulus depends on Young's modulus (Y) and Poisson's ratio (ν). It can also be written as a function of Y and of the shear modulus μ:

$$B = \frac{Y}{3(1-2\nu)} = \frac{Y}{3(3-Y/\mu)} \quad (14)$$

The bulk modulus is determined from measurements of shear modulus and Young's modulus. Assuming that μ and Y are uncertain by 1%, these uncertainties will both contribute uncertainties of about 5% in B. Combining the two uncertainties using root-sum-squares, the uncertainty in B could then be as large as 7%, which will give rise to an unacceptably large uncertainty of $4\times10^{-8}$ in the refractive index. Furthermore, for a cavity such as ours, where the mirrors have fused silica substrates and the body of the resonator is a polymer, commercially available as ZERODUR, the dissimilar materials cause complicated pressure-dependent changes that are not easily predicted from first principles.

Avoid this problem by calibrating with helium. Since the refractive index of helium is known, equation (12) can be used to calculate the change in length of the cavity (more precisely, to determine any possible pressure-induced errors in the system), and this knowledge can be used to correct subsequent measurements. Helium should have good purity, such as having less than 1 part in $10^6$ contaminants. The contaminants most likely to be present will shift the refractive index by several parts in $10^{10}$.

Figure 15:
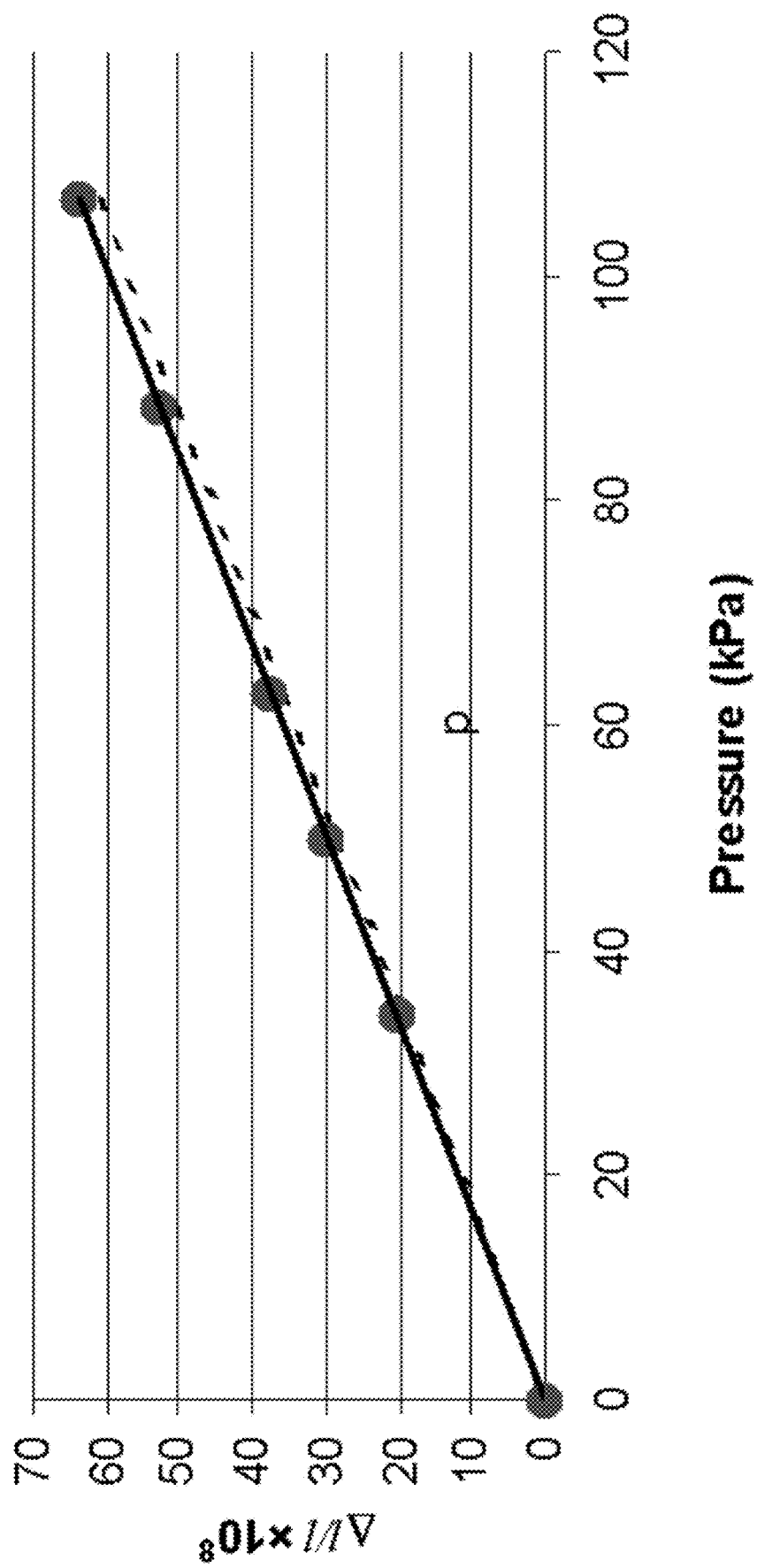
FIG. 15 shows a graph of change in length versus pressure of helium.

We used He gas to measure the distortions Δl/l as a function of pressure. Results for our long cavity are shown in FIG. 15. The dashed line shows a prediction based on the manufacturer's published values of the Young's modulus (90.3 GPa) and Poisson's ratio (ν=0.243). The deviation of experiment from the prediction amounts to an error of $2.8\times10^{-8}$ at atmospheric pressure. However, this deviation does not necessarily arise from imprecise values of Y and ν. One might imagine that additional distortions occur at the ends of the cavity as a consequence of several possible effects. This is particularly true for our cavity because of the dissimilar materials (ZERODUR and fused silica) used in construction, and in fact we have seen some evidence suggesting that the dissimilar materials are a source of distortion. Such effects will be more important in a short cavity than in a long one, and consequently a good way to check for end-effects is to compare results from two cavities of greatly different length. Note that equation (9) implies that fractional changes in frequency df/f are given by $$df/f = -dn/n - dl/l \quad (15)$$

In the absence of end distortion, dl/l should be independent of cavity length. Thus, if two cavities of different length share the same environment (the same dn/n), and in the approximation that the lasers locked to the two cavities have nearly the same frequency f the change in frequency df should be essentially identical for the two cavities. For larger changes in frequency, with df replaced by ΔF (that is, the frequency change is corrected for mode hops) it is again true that the change ΔF for a laser locked to a short cavity should be essentially the same as ΔF for a laser locked to a long cavity. If we look at $F_{short} - F_{Long}$, the difference frequency between the lasers locked to our long and short cavities (the intercavity beat frequency), we would expect that the beat frequency should remain constant as helium is admitted to the cavity. Any variations in the beat (after correction for mode hops) is a very sensitive test of end-effects.

Figure 16:
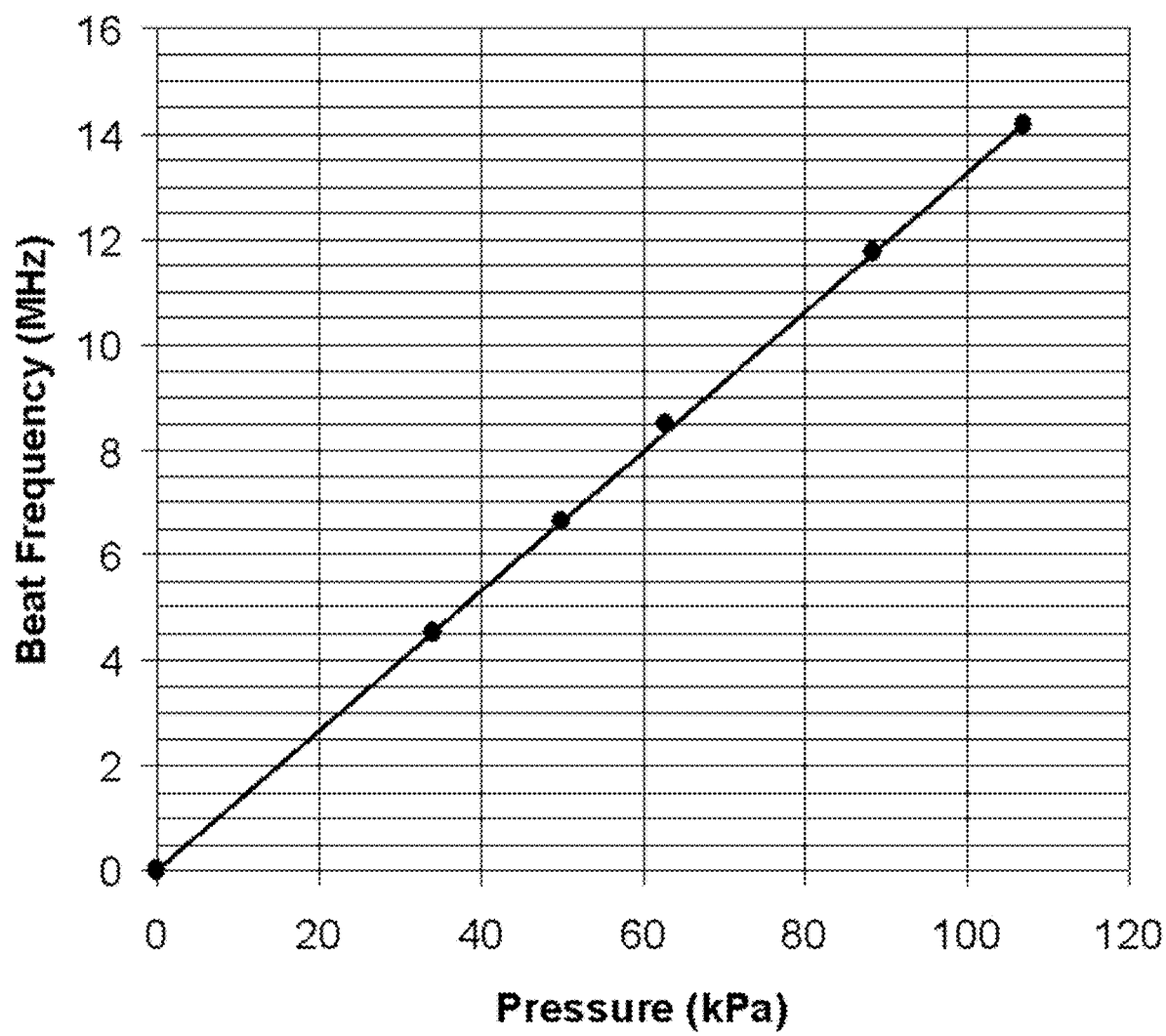
FIG. 16 shows a graph of change in beat frequency versus pressure.

FIG. 16 shows the result of this test using our two cavities. There is a variation of about 14 MHz in the beat frequency as the cavity is filled with helium to atmospheric pressure. 14 MHz represents a discrepancy of 3 parts in $10^8$ of the laser frequency. Attribute this discrepancy to end distortions. These distortions are probably very similar in our long and short cavities, which are identical except for length. However, identical distortions will have about 5 times greater effect on the frequency of our short cavity than on the frequency of the long cavity. Therefore, most of the 14 MHz discrepancy might be attributed to end effects in the short cavity, and end effects in the long cavity are about ⅕ as large. More precisely, under the assumption that both cavities have the same end effects, then the 14 MHz discrepancy arises from a 17.5 MHz effect in the short cavity and 3.5 MHz effect (i.e., 17.5 MHz/5) in the long cavity. Expressed as a fractional frequency shift, the 3.5 MHz error is $7\times10^{-9}$. End effect thus account for a relatively small portion of the discrepancy shown in FIG. 3, with the predominant part of the discrepancy presumably arising from uncertainties in the material properties.

If changes in the FPI are small (or at least predictable) over a period of several years, then the cavity could be operated for long periods of time without the need to evacuate the system and re-establish the vacuum frequency. Influences that must be considered are temperature, humidity, and aging of the cavity.

With regard to aging of the cavity, the long cavity shrank at a rate $\Delta l/l = -3.5\times10^{-8}$ per year. The cavity was usually at temperatures between 22° C. and 25° C. during this time, although it was briefly cycled to temperatures as high as 32° C. or as low as 14° C. The shrinking probably represents instability of the ZERODUR, although part of the temporal changes might also be due to aging of the mirror coatings. The FPI has been under vacuum for the majority of a year but was at atmospheric pressure for significant periods of time as well. We should note that the ZERODUR was manufactured 6 years ago and the mirrors were optically contacted several years ago. ZERODUR that is younger may age at a greater rate. In some cases, even old samples of ZERODUR have been observed to age at a rate of $\Delta l/l = 1\times10^{-7}$ per year. Note that other low-expansion materials might have significantly lower rate of aging.

Figure 17:
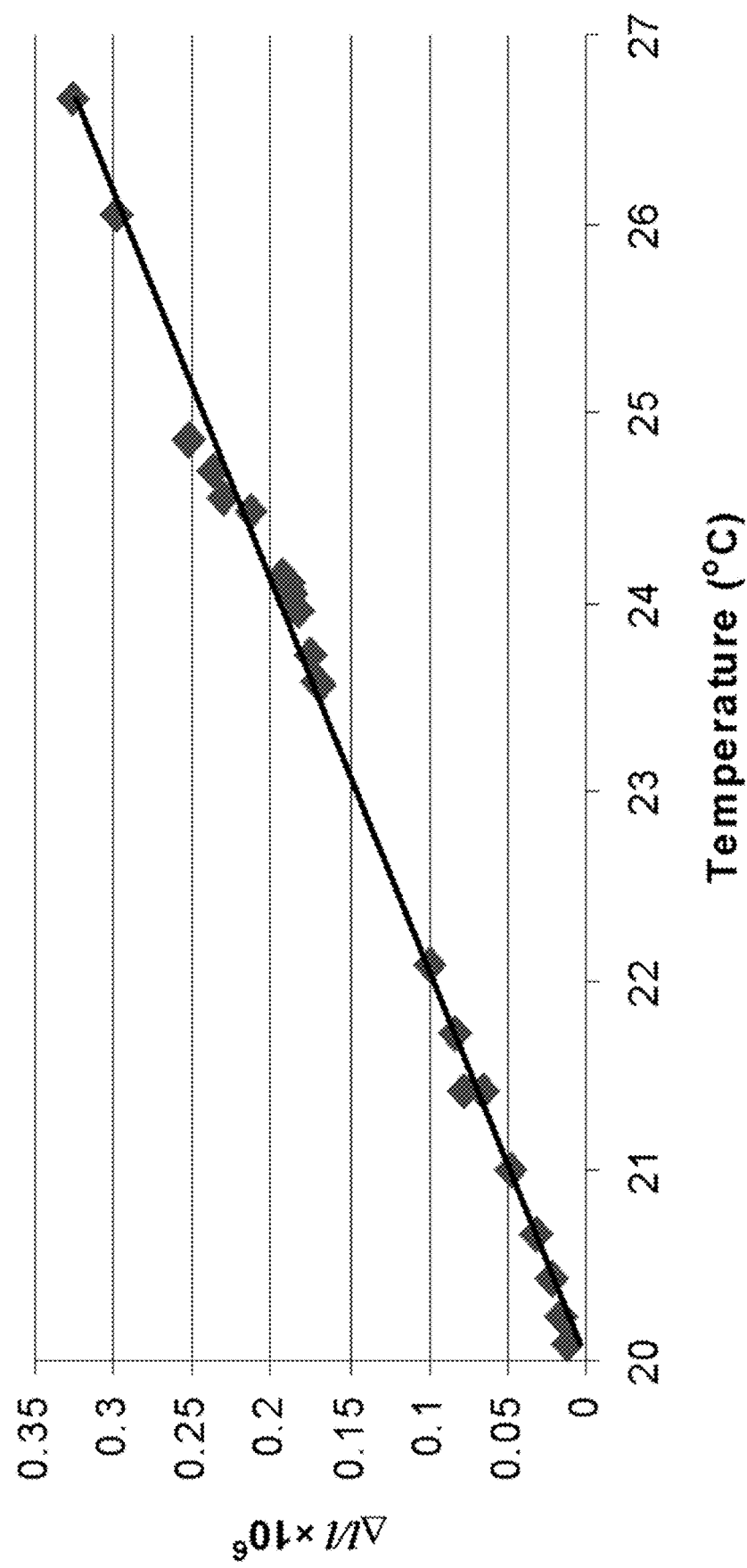
FIG. 17 shows a graph of change in length versus temperature.

With regard to Thermal effects, we measure the thermal expansion of our cavity in vacuum, as shown in FIG. 17. From frequency changes we infer the fractional change in cavity length Δl/l, where Δl is the change in length from the value at 20° C. The expansion coefficient indicated by the slope of the line is $4.9\times10^{-8}/°$ C. About 20% of the expansion is probably associated with end effects, as can be determined by comparing short and long cavities in a manner analogous to what was described previously for pressure variations.

The temperature graph consists of two distinct data sets. First data was taken while the temperature was decreased slowly (over a period of several days) from 26.6° C. to 24.56° C. The temperature was then decreased rapidly to 20° C. for one day, and the remainder of the data was obtained over a period of several days while the temperature increased from 20° C. to 24.47° C.

Over this temperature range the data is nearly linear, but there are noticeable deviations from the best-fit line between 24° C. and 25° C. In this region, the data obtained during cooling lies above the line while the data obtained while heating lies below the line. The deviations, as large as $1.4 \times 10^{-8}$, might be suggestive of either hysteresis or the presence of slow relaxation processes which require long periods of time to reach equilibrium.

Figure 18:
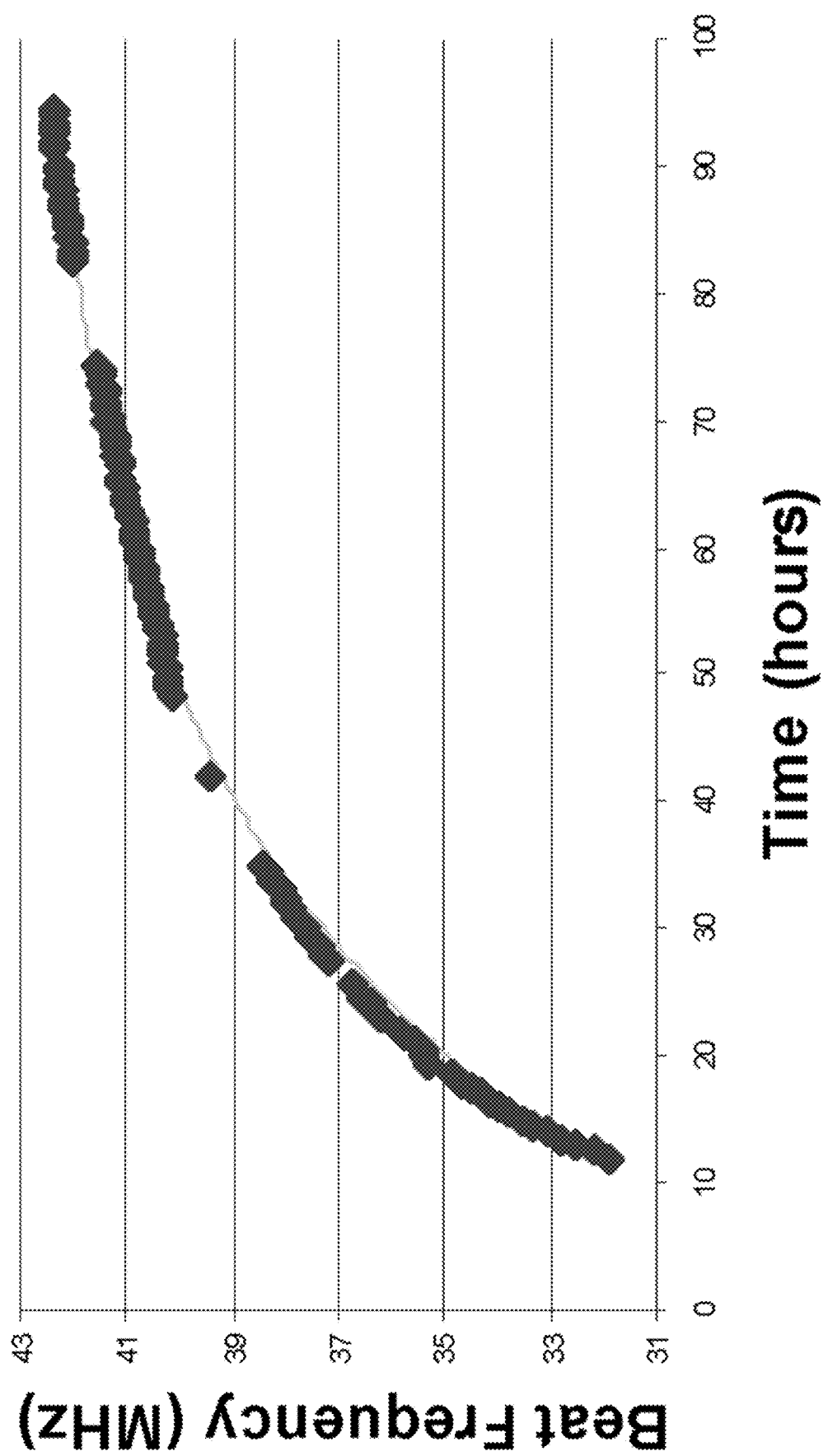
FIG. 18 shows a graph of beat frequency versus time.

We carried out an additional experiment to look more carefully at possible relaxation and hysteresis behavior when the FPI is subject to greater temperature excursions. FIG. 18 shows the relaxation of the long cavity after heating to 30.5° C. for 48 h and then cooling to 24° C. The graph shows the beat frequency between the fixed-wavelength laser and the fixed-frequency laser. The data shown begins 12 h after initiating cooling. At this point in time the ZERODUR temperature was still about 0.1° C. above its equilibrium temperature, but the data has been corrected to constant temperature using the previously measured expansion coefficient. The change in beat frequency of 10 MHz seen in the graph corresponds to a fractional change in length of $2 \times 10^{-8}$. The thin continuous line is an exponential fit to the data with a time constant of 28 h. This time constant is somewhat too slow to account for the early data but somewhat too fast to account for later data. The exponential fit is approaching a value of 42.9 MHz. When we cooled the FPI to 16° C. for two days and then brought it back to 24° C., the beat frequency reached a near-constant value of 44.8 MHz after just 40 h of warming. In this case the approach to equilibrium is significantly faster than seen in FIG. 18. In general, this heating/cooling behavior does not seem to be completely reproducible, and at present it is not clear if the residual 2 MHz difference seen between heating and cooling (corresponding to a change of length of $\Delta l/l \approx 4 \times 10^{-9}$) should be attributed to a very slow relaxation or to permanent hysteresis. In any event, to assure an uncertainty better than $2 \times 10^{-8}$ when using cavities of the present design, it would be advisable to wait several days following a large temperature excursion.

Figure 19:
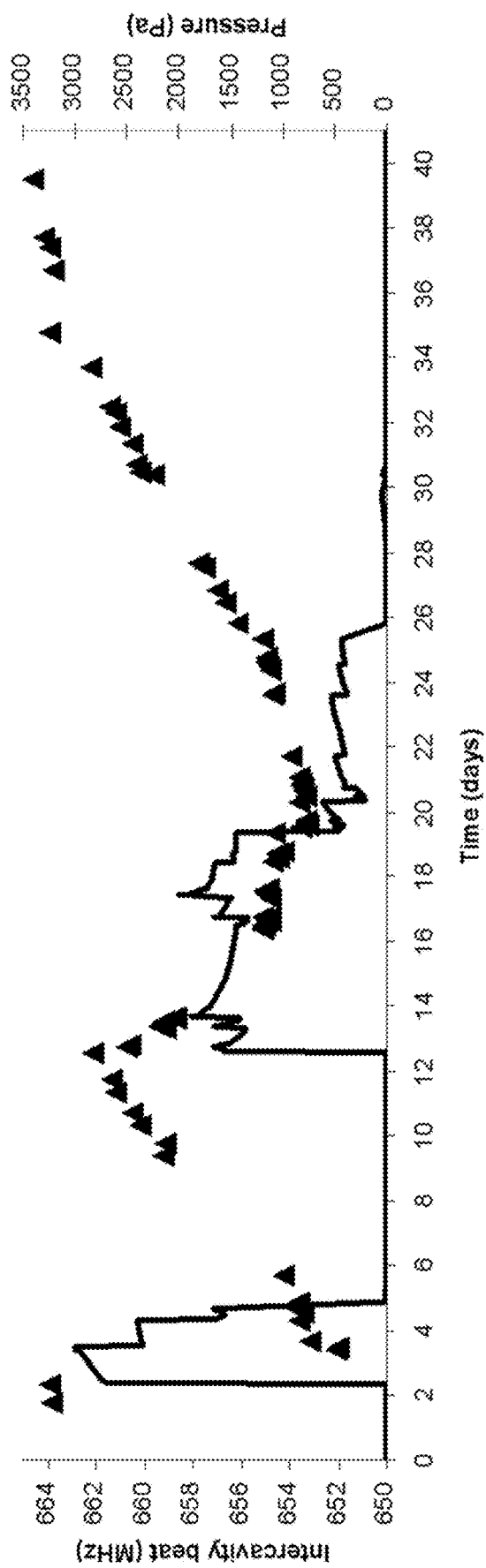
FIG. 19 shows a graph of interactive beat frequency versus time.

With regard to humidity variations, adsorption or absorption of water vapor by the mirror coatings are of potential significance when the FPI is used to measure the refractive index of moist air. We find that humidity has an effect on the apparent length of the cavity, with variations occurring on a time scale of days. We have studied the effect by measuring the beat frequency between the long and short cavity (as we did for pressure) when water vapor is admitted to the chamber. Variations in the beat will occur because humidity, like other end effects, is expected to have about 5 times greater effect on the short cavity than on the long one. We have kept the chamber filled with water vapor for periods up to 1 week to provide time for possible slow penetration of the coatings by vapor. In performing this test, we have used vapor pressures as high as 3 kPa, above the saturation vapor pressure at 20° C. FIG. 19 shows variations in the intercavity beat frequency and water vapor pressure over a period of 40 days. The graph begins at a time when the cavity had been dried under vacuum for 1 week. The beat frequency and humidity are correlated although the correlation is obscured by time constants for changes to take place. The beat frequency under dry conditions (at the start of the graph) decreases rapidly on day 3 when water vapor is introduced at vapor pressures of 2500 Pa to 3000 Pa. When the vapor pressure is reduced again to 2300 Pa on day 4, the beat frequency slowly increases as the FPI cavities dry. When the chamber is evacuated (days 5 through 12), the beat frequency slowly drifts back toward its original dry value of 664 MHz, changing at a rate of about 1 MHz/d. During the second period under vacuum, from day 26 to 34, the cavity shows roughly the same drying trend (about 0.7 MHz/d) until reaching 664 MHz, at which point drying appears to continue only at the much-reduced rate of 0.2 MHz/d.

The shift in beat frequency between the two cavities is as much as 13 MHz. Over a more realistic range of vapor pressure, from 1650 Pa to 370 Pa (corresponding to relative humidity ranging from 71% to 16% at 20° C.), the inter-cavity beat frequency appears to shift by as much as 5 MHz. Under the assumption that all of the cavity mirrors behave in the same manner, this would imply that the absolute shift of the short cavity frequency is 6.3 MHz ($1.3 \times 10^{-8}$ relative error) while the long cavity shifts by 1.3 MHz ($2.8 \times 10^{-9}$). Direct measurement of the shift of the long cavity suggests that the actual problem is probably somewhat larger than this value, but well below $1 \times 10^{-8}$.

Humidity response can be highly dependent on the type of mirror coatings used. Currently we are using mirrors with an RF magnetron sputtered $SiO_2$ outer layer covering evaporated $SiO_2/TiO_2$ inner layers.

(d) Other Tests: For dry gasses we expect to achieve much lower uncertainty than when measuring moist air. As described in previous publications [2,15], we have used our FPI refractometer to measure the molar refractivity of nitrogen and we find a result that is consistent with other studies, within the uncertainties of our measurement and of the previous measurements (a few parts in $10^8$). However, this test is of limited value for exploring the ultimate achievable performance of the FPI refractometer, because the uncertainty of this measurement is dominated by uncertainties in measuring the nitrogen pressure and temperature. (These measurements are not needed to determine refractive index, but they are needed to determine the molar refractivity.) A more sensitive test (of a limited subset of all possible errors) is to compare results between our two FPI systems when they simultaneously measure the same sample of nitrogen gas. The result is independent of uncertainty in the pressure and temperature measurement, but will expose many other potential errors because the two systems (gas laser locked to the long cavity and diode laser locked to a much shorter cavity) are sufficiently different that the comparison will uncover many potential errors, including end-effects, errors in determination of the cavity fsr, or error in accurately locking the laser to the FPI cavity. We find that the two FPI cavities give the same answer for nitrogen refractive index within a few parts in $10^9$, where the residual disagreement is within our expected uncertainty.

The good agreement of the two FPI systems at the $10^{-9}$ level is suggestive that high accuracy can be achieved using this type of system. It is possible that relatively straightforward (but difficult) improvements in our system could achieve uncertainties well below $10^{-9}$. The high potential accuracy of the system is suggestive that refractive index measurements made with the system can be used to infer pressure. More precisely, from refractive index one can infer density [18], and if either temperature or pressure is known, the other can be calculated. Under normal laboratory conditions it is somewhat easier to measure temperature than pressure, and therefore it is of interest to consider using the refractive index measurements for pressure determination. Pressure transfer standards and absolute pressure standards are both possible.

Most straightforward is to use an FPI-based refractometer filled with nitrogen as a pressure transfer standard, calibrated against an absolute standard. The FPI has high resolution and good long-term stability. We currently achieve about 0.1 Pa useful resolution at atmospheric pressure. Note that a change in nitrogen pressure of 0.1 Pa will change the nitrogen refractive index by $3 \times 10^{-10}$. A temperature change of 0.3 mK would cause this same change in refractive index, so temperature must be measured with this resolution, and careful monitoring of the long-term stability of the temperature sensor would be required to assure the long-term reliability of pressure measurement. Short and long-term frequency fluctuations of the fixed-frequency laser are also a potential concern if using commercial stabilized lasers, but the fluctuations are negligible when using an iodine stabilized laser as the fixed frequency source. If the stability of the cavity is monitored by periodically measuring the laser frequency under vacuum, it should be possible to correct for long-term drift in cavity length.

An absolute pressure standard might also possible, based on the calculated refractive index of helium. A relative uncertainty as low as $1.8 \times 10^{-6}$ might be achieved, limited by the current CODATA uncertainty of the Boltzmann constant. This corresponds to an uncertainty of 0.18 Pa at atmospheric pressure. To achieve this, it would be necessary to measure the refractive index of helium with an uncertainty below $5 \times 10^{-11}$. Although there is no compelling reason that this performance could not be achieved, it is several orders of magnitude better than what has been demonstrated by existing refractometers.

The FPI cavity measures dispersion in helium rather than directly measuring refractive index. Pressure can be determined from the measured difference between refractive indices at two widely spaced frequencies. This is again limited to a fractional uncertainty of about $2 \times 10^{-6}$ by the Boltzmann constant. As an example of the dispersion technique, one might imagine measuring the dispersion between 816 nm and its third harmonic, 272 nm. The change in refractive index between 272 nm and 816 nm is a little less than $1 \times 10^{-6}$ for helium at atmospheric pressure and 20° C. To achieve 0.2 Pa resolution, it is necessary to measure this $1 \times 10^{-6}$ change in refractive index with a fractional uncertainty of $2 \times 10^{-6}$, corresponding to a fractional change in laser frequency of only $2 \times 10^{-12}$.

Mirror phase shifts and the Guoy phase shift can be large relative to the required accuracy. It is desirable to employ dielectric mirrors with good reflectivity, but the associated phase shifts can cause problems. In theory, a cavity mirror consisting of an ideal quarter-wave stack with the center of the reflection band at 816 nm should also provide good performance at the third harmonic. For an ideal quarter wave stack made from nondispersive materials and operating at the center of the transmission band, both the fundamental and third harmonic undergo a 180o phase shift on reflection, and problems associated with mirror phase shifts essentially disappear. For a real mirror made from dispersive materials, and including possible uncertainty in the center of the transmission band, the phase shifts might be on the order of hundreds of kilohertz (very large relative to the desired uncertainty). However, if the phase shifts do not change appreciably when gas is admitted to the cavity, then comparing frequencies measured under vacuum to frequencies seen when helium is present will eliminate this problem to first order. The Guoy phase shifts will not present a serious problem, but the mirror phase shift depends on pressure in the cavity because the helium refractive index changes the magnitude of the reflection at the first surface of the mirror. For ideal mirrors with 180o phase shifts the problem vanishes, because the first-surface reflection is in phase with the reflection from the bulk of the mirror. Under these circumstances the phase shift will not be affected by the change in the magnitude of the reflection at the first surface. Once again, dispersion or uncertainty in the center wavelength complicates the picture, and it could be difficult to assure that errors at the kilohertz level are avoided; it might be necessary to use two cavities of different lengths to quantify this problem.

An additional problem of significance is that the dispersion of helium is so small relative to other gasses. Impurities in the helium must be reduced below about 1 part in 107 in order to keep the fractional effect on dispersion below 2×10-6 and thus achieve 0.2 Pa uncertainty at atmospheric pressure.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A deformometer for determining deformation of an optical cavity optic disposed on an optical cavity, the deformometer comprising:
the optical cavity comprising:
a cavity body;
an entry optical cavity optic disposed at an entry end of cavity body and that receives combined light; and
an exit optical cavity optic disposed at an exit end of cavity body, the entry optical cavity optic in optical communication and optically opposing the exit optical cavity optic, such that the exit optical cavity optic receives the combined light from the entry optical cavity optic, such that the optical cavity;
receives gas through which the combined light propagates; and
produces filtered combined light from the combined light;

a first laser in optical communication with entry optical cavity optic and that provides first light;

a second laser in optical communication with entry optical cavity optic and that provides second light;

an optical combiner in optical communication with the entry optical cavity optic and that:
receives the first light from the first laser;
receives the second light from the second laser;
combines the first light and the second light;
produces combined light from the first light and the second light; and
communicates the combined light to the entry optical cavity optic;

a beam splitter in optical communication with the exit optical cavity optic and that:
receives the filtered combined light from the optical cavity;
splits the filtered combined light into first filtered light and second filtered light;

a first light detector in optical communication with the beam splitter and that:
receives the first filtered light from the beam splitter; and
produces a first cavity signal from the first filtered light; and a second light detector in optical communication with the beam splitter and that:
receives the second filtered light from the beam splitter; and
produces a second cavity signal from the second filtered light, from which a deformation of the entry optical cavity optic and exit optical cavity optic is determined.

2. The deformometer of claim 1, further comprising a lens in optical communication with the optical combiner and that receives the combined light from the optical combiner and focuses the combined light.

3. The deformometer of claim 1, further comprising a mirror in optical communication with the first laser and the second laser.

4. A process for determining deformation of an optical cavity optic disposed on an optical cavity with a deformometer, the process comprising:
combining first light with second light;
producing combined light from the first light and the second light;
receiving, by an entry optical cavity optic disposed at an entry end of a cavity body of a deformometer, the combined light;
transmitting, from the first optical cavity optic to an exit optical cavity optic disposed at an exit end of the cavity body, the combined light, the entry optical cavity optic being in optical communication and optically opposing the exit optical cavity optic;
receiving, by the exit optical cavity optic, the combined light;
producing a filtered combined light from the combined light transmitted from the first optical cavity optic and from the second optical cavity optic;
producing, from the filtered combined light, a first filtered light and a second filtered light; and
analyzing the first filtered light and the second filtered light to determine the deformation of the entry optical cavity optic and the exit optical cavity optic.

\* \* \* \* \*